(12) United States Patent
Chen et al.

(10) Patent No.: US 12,406,938 B2
(45) Date of Patent: Sep. 2, 2025

(54) METHODS OF FORMING ALIGNMENT STRUCTURE WITH TRENCHES FOR SEMICONDUCTOR DEVICES

(71) Applicant: Taiwan Semiconductor Manufacturing Co., Ltd., Hsinchu (TW)

(72) Inventors: Wen-Yen Chen, Hsinchu (TW); Tsai-Yu Huang, Taoyuan (TW); Huicheng Chang, Tainan (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 676 days.

(21) Appl. No.: 17/689,413

(22) Filed: Mar. 8, 2022

(65) Prior Publication Data
US 2023/0050645 A1    Feb. 16, 2023

Related U.S. Application Data

(60) Provisional application No. 63/232,755, filed on Aug. 13, 2021.

(51) Int. Cl.
| | | |
|---|---|---|
| H01L 23/544 | (2006.01) | |
| H01L 21/02 | (2006.01) | |
| H01L 21/324 | (2006.01) | |
| H10D 30/01 | (2025.01) | |
| H10D 30/67 | (2025.01) | |
| H10D 62/10 | (2025.01) | |
| H10D 64/01 | (2025.01) | |

(52) U.S. Cl.
CPC ........ *H01L 23/544* (2013.01); *H01L 21/0259* (2013.01); *H01L 21/3247* (2013.01); *H10D 30/031* (2025.01); *H10D 30/6735* (2025.01); *H10D 30/6757* (2025.01); *H10D 62/118* (2025.01); *H10D 64/017* (2025.01); *H01L 2223/54426* (2013.01)

(58) Field of Classification Search
CPC . H01L 23/544; H01L 21/0259; H10D 30/024; H10D 30/62
USPC .......................................................... 257/347
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |

(Continued)

*Primary Examiner* — Quoc D Hoang
(74) *Attorney, Agent, or Firm* — Slater Matsil, LLP

(57) ABSTRACT

A method of forming a semiconductor device is provided. The method includes providing a substrate having a first region and a second region; forming a plurality of trenches in the first region of the substrate; forming a multi-layer stack over the substrate and in the trenches; and patterning the multi-layer stack and the substrate to form first nanostructures over first fins in the first region and second nanostructures over second fins in the second region, where the multi-layer stack includes at least one of first semiconductor layers and at least one of second semiconductor layer stacked alternately, and the plurality of trenches are in corresponding ones of the first fins.

20 Claims, 34 Drawing Sheets

(56) References Cited

U.S. PATENT DOCUMENTS

| | | |
|---|---|---|
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2009/0079002 A1 | 3/2009 | Lee et al. |
| 2016/0307850 A1 | 10/2016 | Lin et al. |
| 2019/0043993 A1 | 2/2019 | Mohapatra et al. |
| 2020/0219760 A1* | 7/2020 | Kantarovsky ......... H01L 21/302 |
| 2022/0139783 A1* | 5/2022 | Gardner ............ H01L 29/66439 438/154 |

* cited by examiner

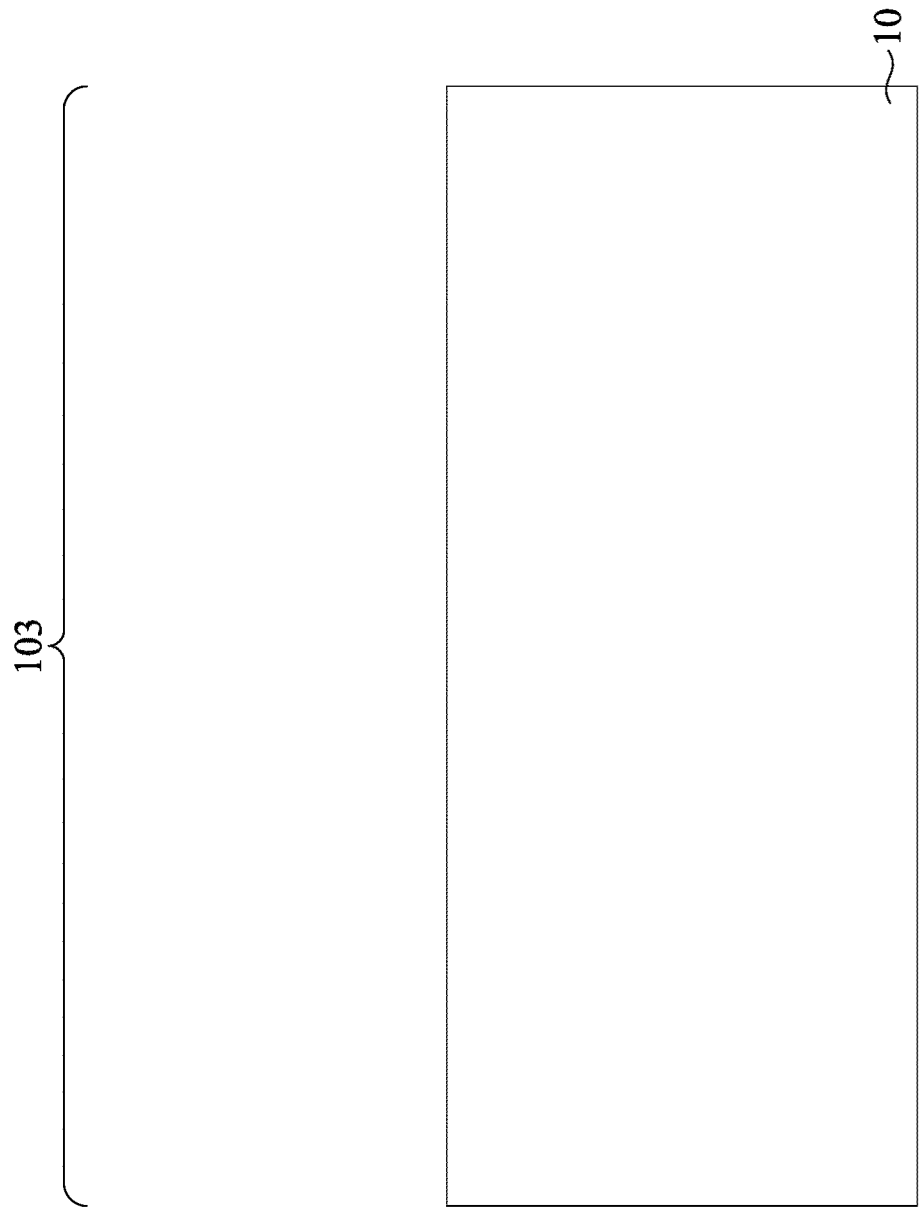

METHODS OF FORMING ALIGNMENT STRUCTURE WITH TRENCHES FOR SEMICONDUCTOR DEVICES

PRIORITY CLAIM AND CROSS-REFERENCE

This application claims the benefit of U.S. Provisional Application No. 63/232,755, Filed on Aug. 13, 2021 and entitled "Zero Layer Lithography Overlay Reflection Position Accuracy by Depositing SiGe Nanosheet into Alignment Mark," which application is hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers and semiconductor layers over a semiconductor substrate and patterning the various layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum feature sizes are reduced, additional problems arise that should be addressed.

BRIEF DESCRIPTION OF THE DRAWINGS

The present disclosure is best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 4A, 6A, 7A, 8A, 9A, 10A, 11, 12A, 13A, 14A, 15A, 16A, 17, 18A, 19A, 3B, 4B, 6B, 7B, 8B, 9B, 10B, 12B, 13B, 14B, 15B, 16B, 18B, 19B, and 20 are cross-sectional views of intermediate stages in the manufacturing of nano-FETs in accordance with some embodiments.

DETAILED DESCRIPTION

Figure 1:
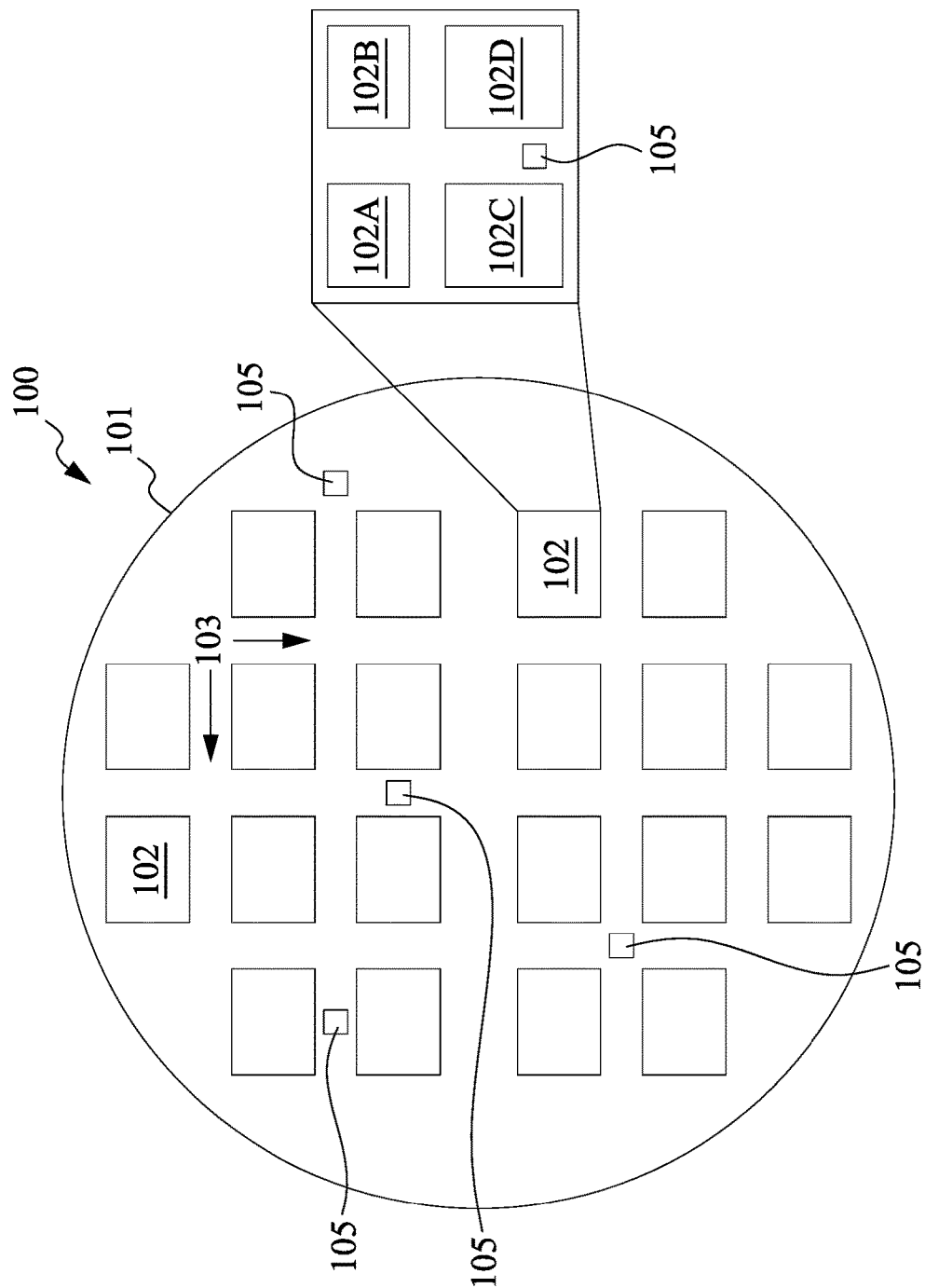
FIG. 1 illustrates a top view of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a top view of a semiconductor device 100 in accordance with some embodiments. In some embodiments, the semiconductor device 100 includes a wafer 101. The wafer 101 may include a plurality of chip regions 102 (or referred as to active regions) separated from each other by dicing regions 103. In some embodiments, each of the chip regions 102 may include a semiconductor device. Such semiconductor device may include a transistor such as nano-FETs, FinFETs, other multi-gate transistors, planar transistors, bipolar junction transistors, or other types of devices such as resistors, capacitors, inductors, diodes, fuses, static random-access memory (SRAM), and/or other logic circuits, etc. The dicing regions 103 may also be referred to as singulation regions or isolation regions. In some embodiments, the wafer 101 may be singulated along the dicing regions 103 to separate the chip regions 102 from each other and form individual chips. In some embodiments, the semiconductor device 100 further includes alignment structures 105 disposed in the dicing regions 103. In some embodiments, the alignment structures 105 may be disposed at an edge of the wafer 101. In other embodiments, the alignment structures 105 may be disposed at corners of the chip regions 102. In yet other embodiments, the alignment structures 105 may be disposed at edges of the chip regions 102. The alignment structures 105 may also be referred to as alignment marks. In some embodiments, when the alignment structures 105 are formed in the dicing regions 103, the alignment structures 105 may be damaged or destroyed by the singulation process.

In some embodiments, each of the chip regions 102 includes one or more chips. For example, in the embodiments illustrated in FIG. 1, each of the chip regions 102 includes four chips, such as chips 102A, 102B, 102C, and 102D. In other embodiments, each of the chip regions 102 may include less or more than four chips depending on the design requirements. In some embodiments, when each of the chip regions 102 includes a plurality of chips, the alignment structures 105 may be disposed within the chip regions 102 between adjacent chips. In such embodiments, the alignment structures 105 are not damage or destroyed during the singulation process and retain in the final products.

Figure 2:
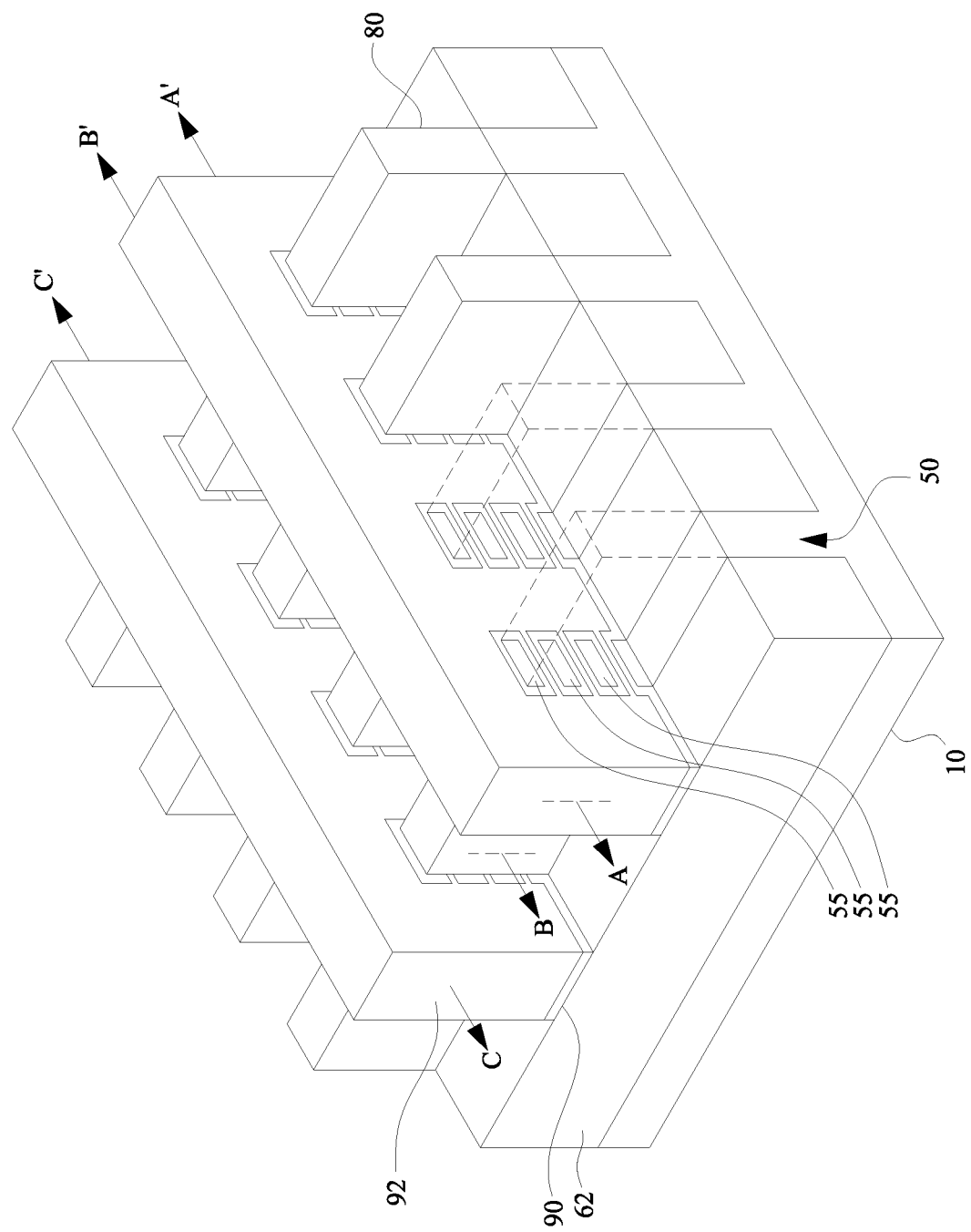
FIG. 2 illustrates an example of nano-FETs in a three-dimensional view in accordance with some embodiments.

FIG. 2 illustrates an example of nano-FETs (e.g., nanowire FETs, nanosheet FETs, or the like) in a three-dimensional view, in accordance with some embodiments. The nano-FETs include nanostructures 55 (e.g., nanosheets, nanowire, or the like) over fins 50 on a substrate 10 (e.g., a semiconductor substrate), wherein the nanostructures 55 act as channel regions for the nano-FETs. The nanostructures 55 may include P-type nanostructures, N-type nanostructures, or a combination thereof. Isolation features 62 are disposed between adjacent fins 50, which may protrude above and between neighboring isolation features 62. Although the isolation features 62 are described/illustrated as being separate from the substrate 10, as used herein, the term "substrate" may refer to the semiconductor substrate alone or a combination of the semiconductor substrate and the isolation regions. Additionally, although a bottom portion of the fins 50 is illustrated as being single, continuous materials with the substrate 10, the bottom portion of the fins 50 and/or the substrate 10 may include a single material or a plurality of materials. In this context, fins 50 refer to the portion extending between the neighboring isolation features 62.

Gate dielectric layer 90 are over top surfaces of the fins 50 and along top surfaces, sidewalls, and bottom surfaces of the nanostructures 55. Gate electrodes 92 are over the gate dielectric layers 90. Source/drain features 80 are disposed over the fins 50 on opposing sides of the gate dielectric layers 90 and the gate electrodes 92.

FIGS. 3A through 19B are cross-sectional views of intermediate stages in the manufacturing of nano-FETs in the chip regions and the dicing regions, in accordance with some embodiments. FIGS. 3A, 4A, 6A through 10A, 11, 12A through 16A, 18A, and 19A illustrate reference cross-section A-A' illustrated in the chip region 102. The cross-section A-A' is along a longitudinal axis of the gate electrodes 92 and in a direction, for example, perpendicular to a direction of a current flow between the source/drain features 80 of the nano-FETs illustrated in FIG. 2. FIG. 17 illustrates reference cross-section B-B' illustrated in the chip region 102. The cross-section B-B is parallel to cross-section A-A' and extends through the source/drain features 80 of the nano-FETs illustrated in FIG. 2. FIGS. 3B, 4B, 6B through 10B, 12B through 16B, 18B, and 19B illustrate reference cross-section C-C' illustrated in the dicing region 103. The cross-section C-C' is along a direction that is parallel to the cross-section A-A' and extends through the dicing region 103.

Figure 3A:
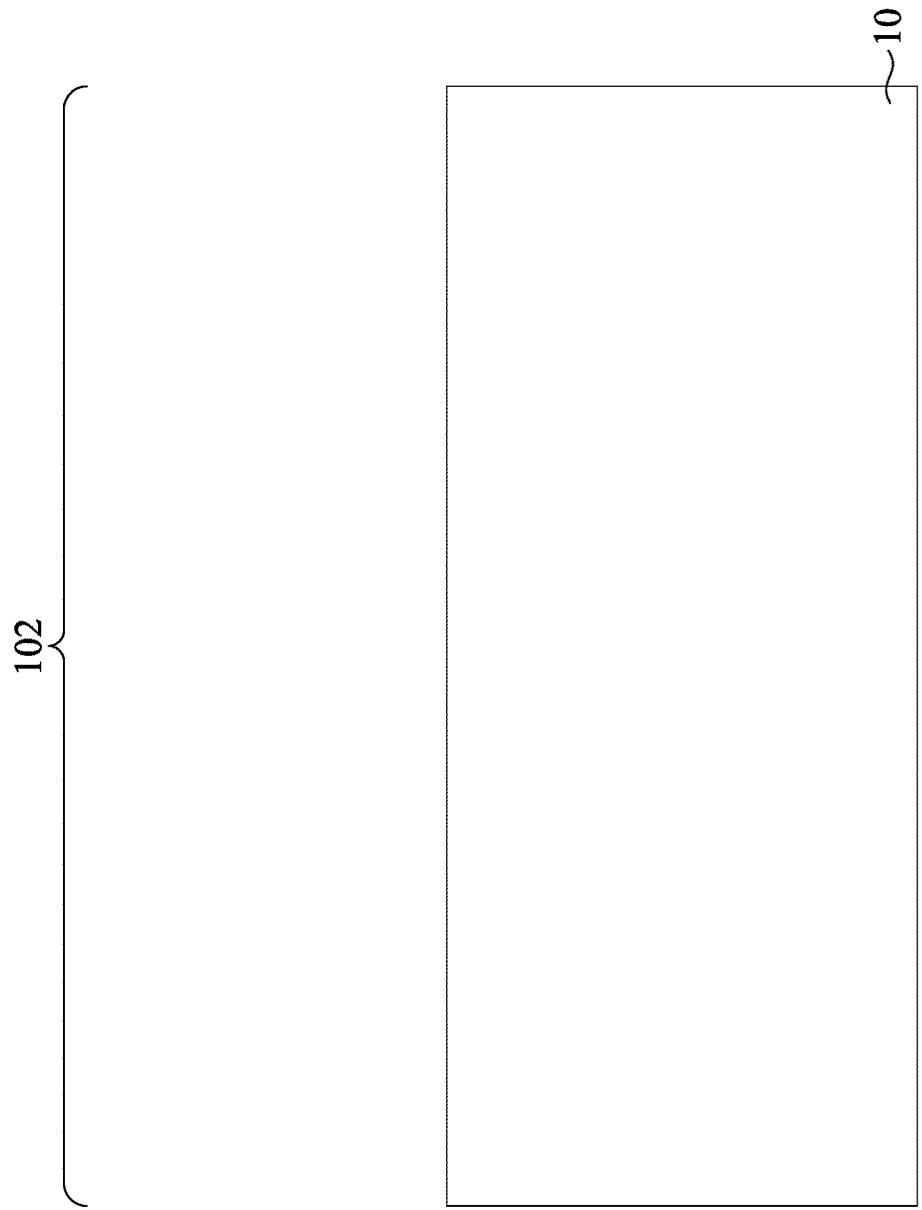

Referring to FIGS. 3A and 3B, a substrate 10 having a chip region 102 and a dicing region 103 is provided. The substrate 10 may be a semiconductor substrate, such as a bulk semiconductor, a semiconductor-on-insulator (SOI) substrate, or the like, which may be doped (e.g., with a P-type or an N-type dopant) or undoped. The substrate 10 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate, may also be used. In some embodiments, the semiconductor material of the substrate 10 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

Figure 4A:
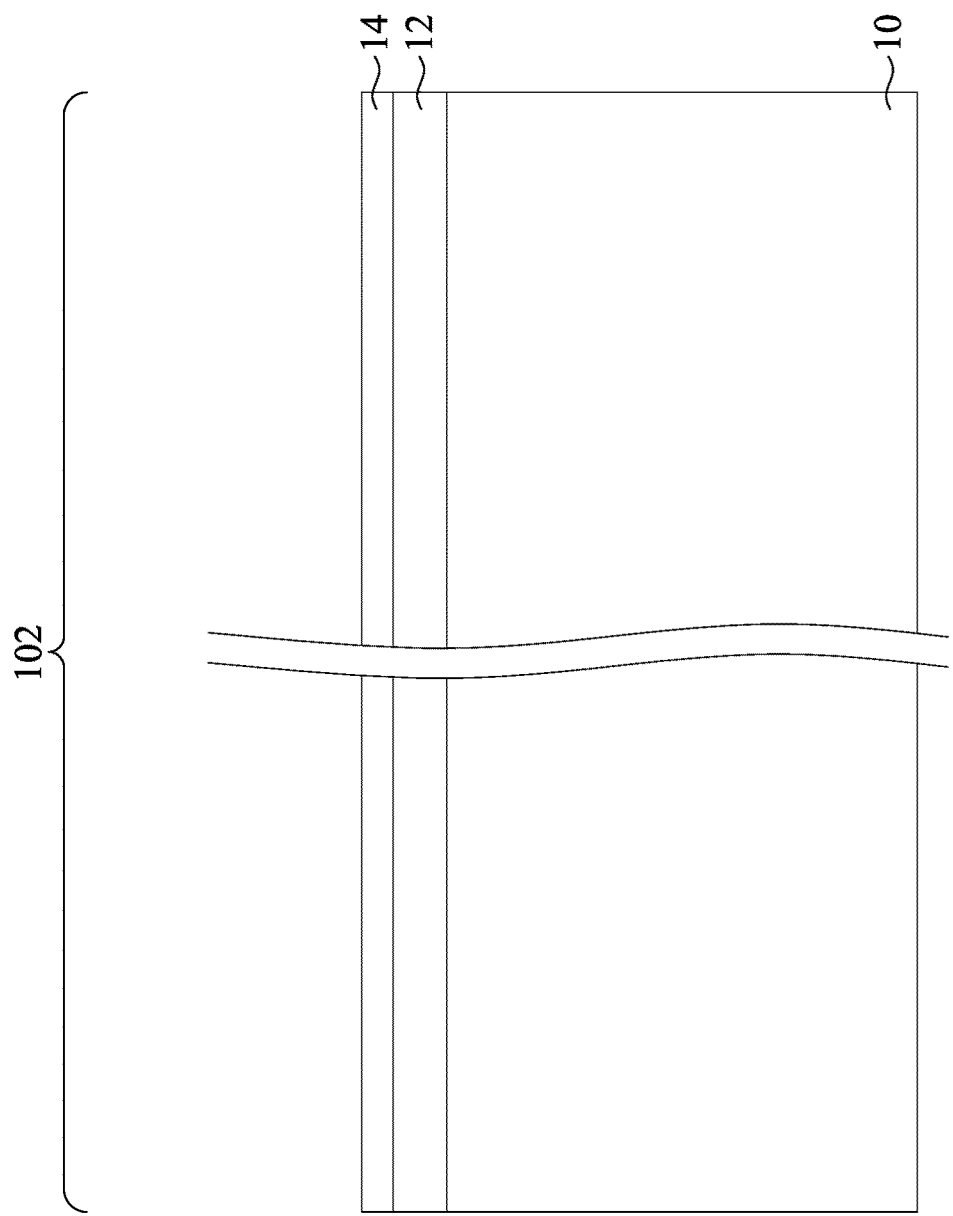
Figure 4B:
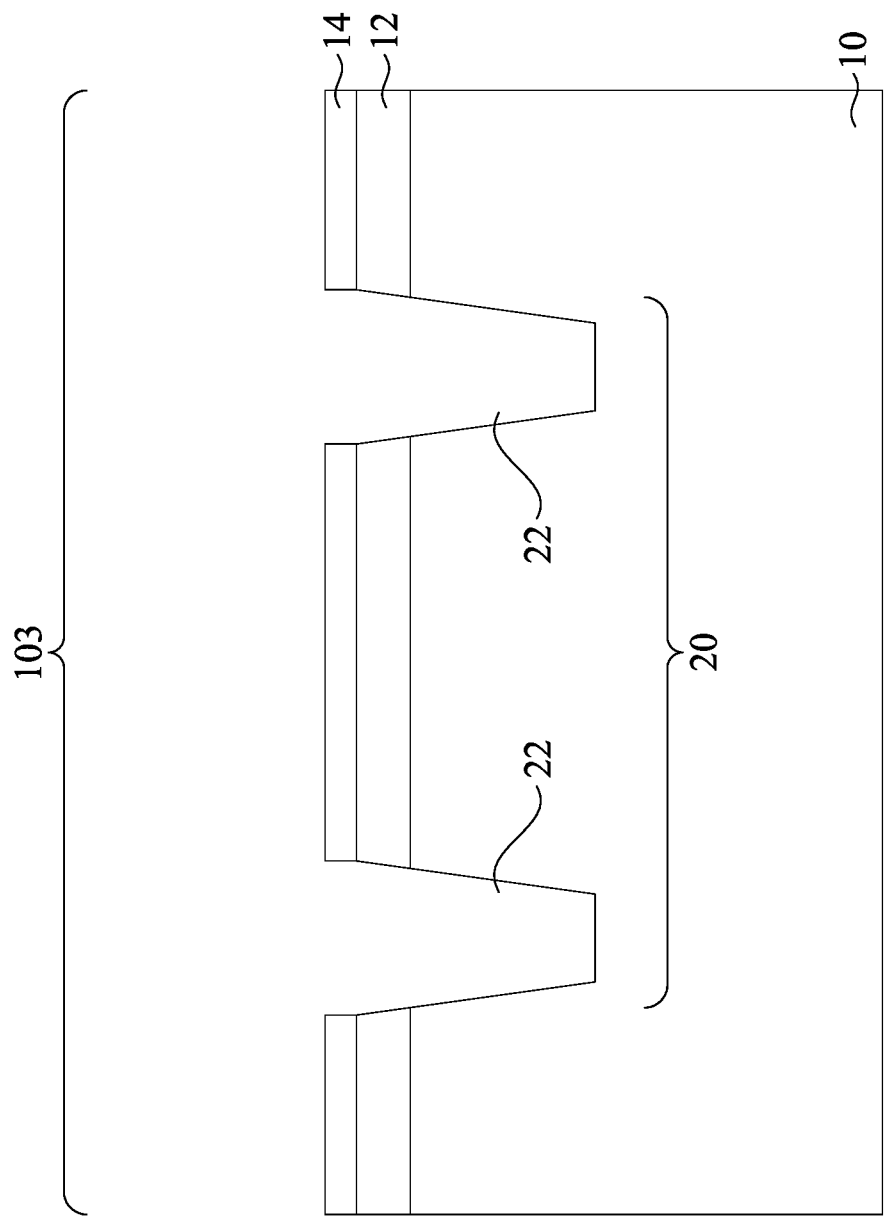

Referring to FIGS. 4A and 4B, a first mask layer 12 is formed over the substrate 10, in accordance with some embodiments. A second mask layer 14 is formed over the first mask layer 12, in accordance with some embodiments. The first mask layer 12 may include an oxide layer (e.g., silicon oxide). For example, the first mask layer 12 may include thermally grown oxide, oxide deposited by chemical vapor deposition (CVD), and/or oxide deposited by atomic layer deposition (ALD). By way of example, the first mask layer 12 may have a thickness of between about 2 nm and about 30 nm, or a thickness of between about 5 nm and about 10 nm. In some embodiments, the second mask layer 14 includes silicon nitride, aluminum nitride, or other suitable materials. The second mask layer 14 may be deposited by CVD, plasma-enhanced CVD (PECVD), or other suitable deposition techniques. In some embodiments, the second mask layer 14 has a thickness of between about 1 nm and about 100 nm.

An etching process is then applied to form a substrate alignment structure 20. The substrate alignment structure 20 may include a plurality of trenches 22 within the substrate 10. The etching process may include an anisotropic etching process such as reactive ion etching or ion beam etching. In some embodiments, each of the trenches 22 has a depth of about 50 nm to about 250 nm, or about 80 nm to about 100 nm. In some embodiments, the trenches 22 may have an aspect ratio about 10:1 to about 1:1, or for example, about 5:2. The second mask layer 14 may be removed after the substrate alignment structure 20 is formed.

Figure 5:
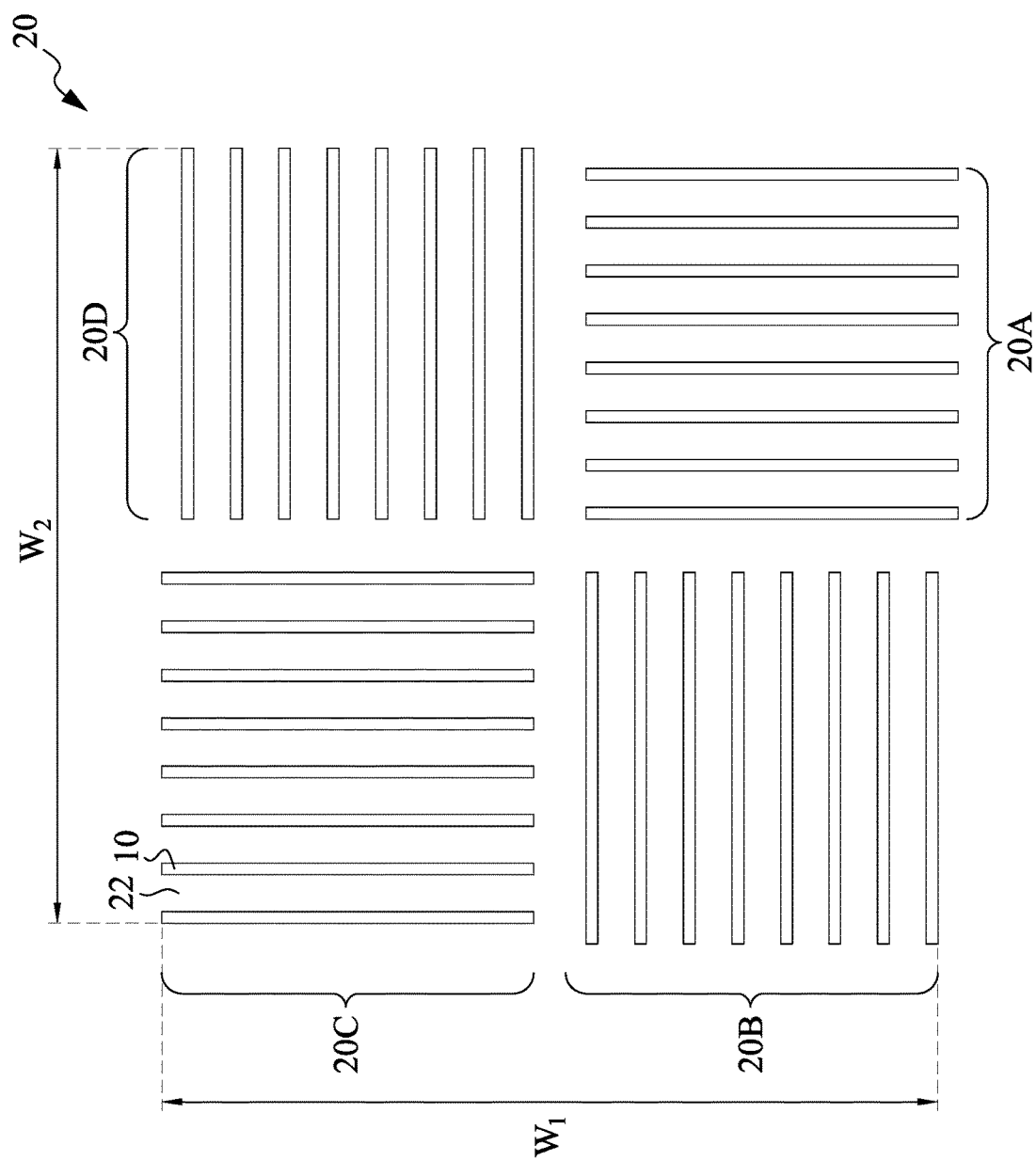
FIG. 5 is a top view of an alignment structure in accordance with some embodiments.

FIG. 5 illustrates a top view of the substrate alignment structure 20 in accordance with some embodiments. In some embodiments, the substrate alignment structure 20 includes regions 20A, 20B, 20C, and 20D. In some embodiments, the regions 20A and 20C of the substrate alignment structure 20 may have the same first pattern. In some embodiments, the regions 20B and 20D of the substrate alignment structure 20 may have the same second pattern. In some embodiments, 90 degree-rotated first pattern is similar to the second pattern. The substrate alignment structure 20 has a first width $W_1$ and a second width $W_2$. In some embodiments, the first width $W_1$ equal the second width $W_2$. In other embodiments, the first width $W_1$ is different from the second width $W_2$. In some embodiments, the first width $W_1$ is between about 50 nm and about 1000 nm. In some embodiments, the second width $W_2$ is between about 50 nm and about 1000 μm. In some embodiments, a ratio $W_1/W_2$ is about 1. Registration and overlay errors may be reduced by aligning photomasks to the substrate alignment structure 20 in the subsequent lithography processes.

Figure 6A:
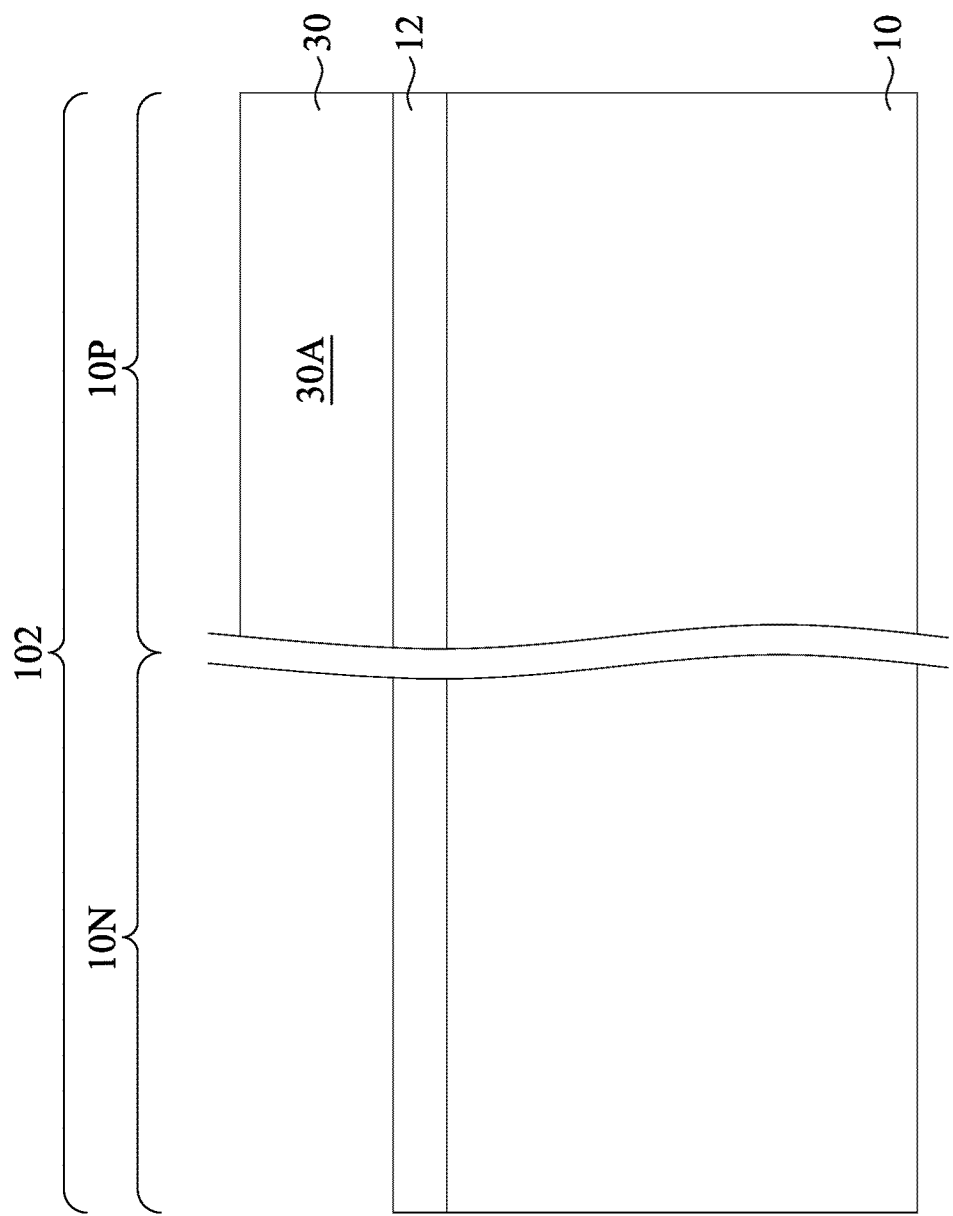
Figure 6B:
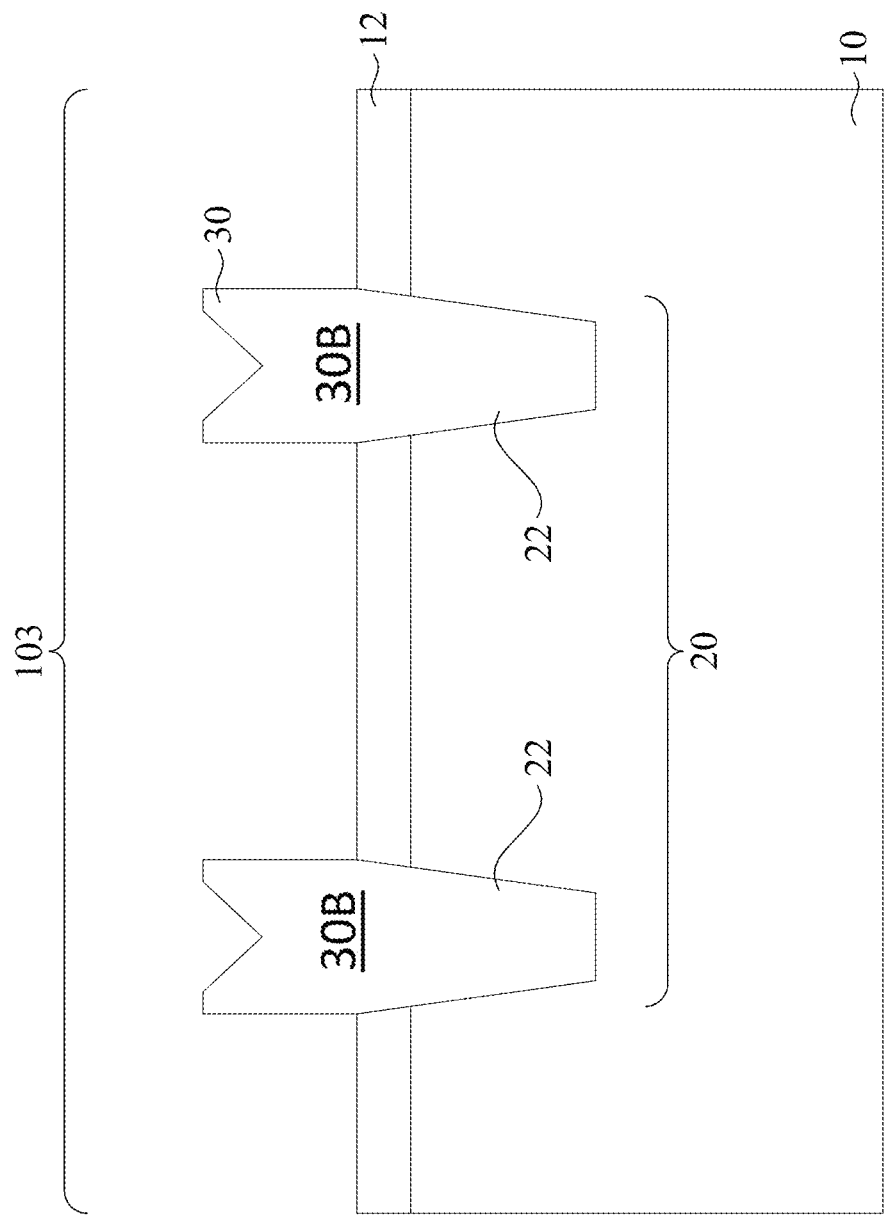

In FIGS. 6A and 6B, appropriate wells may be formed in the substrate 10. In some embodiments, a P-type well is formed in the N-type region 10N, and an N-type well is formed in the P-type region 10P. In other embodiments, a P-type well and an N-type well are formed in both N-type region 10N and P-type region 10P. In the embodiment with different types of wells, the different implant steps for the N-type region 10N and P-type region 10P may be achieved using a photoresist or other masks. For example, referring to FIGS. 6A and 7A, a first lithography step is performed to pattern a P-type well in the N-type region 10N. A second lithography step is performed to pattern an N-type well region in the P-type region 10P. It will be understood that the first and second lithography steps may be performed in any order; for example, the N-type well in the P-type region 10P may be implanted before the P-type well in the N-type region 10N.

Performing the first lithography step may include forming a photoresist layer over the substrate 10, exposing the photoresist layer according to a pattern of a photomask, performing post-exposure bake processes, and developing the photoresist layer to form a patterned photoresist layer 30. In some embodiments, as illustrated in FIGS. 6A and 6B, the patterned photoresist layer 30 has a first portion 30A in the chip region 102 and a second portion 30B in the dicing regions 103. The second portion 30B of the patterned photoresist layer 30 may be deposited over the trenches 22 and has protrusions that align to the trenches 22 and protrude over the substrate 10. The second portion 30B of the patterned photoresist layer 30 may be used to infer the exact position of the first portion 30A of the patterned photoresist layer 30 (e.g., P-type implant mask) in the chip region 102. For example, the position shift of the first portion 30A of the patterned photoresist layer 30 in the chip region 102 may be inferred by measuring the overlay position shift between the second portion 30B of the patterned photoresist layer 30 and the substrate alignment structure 20.

After the patterned photoresist layer 30 is formed, an ion implantation process is performed into the N-type region 10N to form the P-type well, while the P-type region 10P remains masked by the patterned photoresist layer 30. By way of example, P-type impurities implanted via the ion implantation process into the P-type well may include boron, aluminum, gallium, indium, or other P-type acceptor material. After the ion implantation process, the patterned photoresist layer 30 may be removed, for example, by way of a solvent, resist stripper, ashing, or other suitable technique. The P-type impurities are implanted in the N-type region 10N to a dose of equal to or less than $10^{15}$ cm$^{-2}$, such as between about $10^{12}$ cm$^{-2}$ and about $10^{15}$ cm$^{-2}$. In some embodiments, the P-type impurities may be implanted at an implantation energy of about 1 keV to about 10 keV.

Figure 7A:
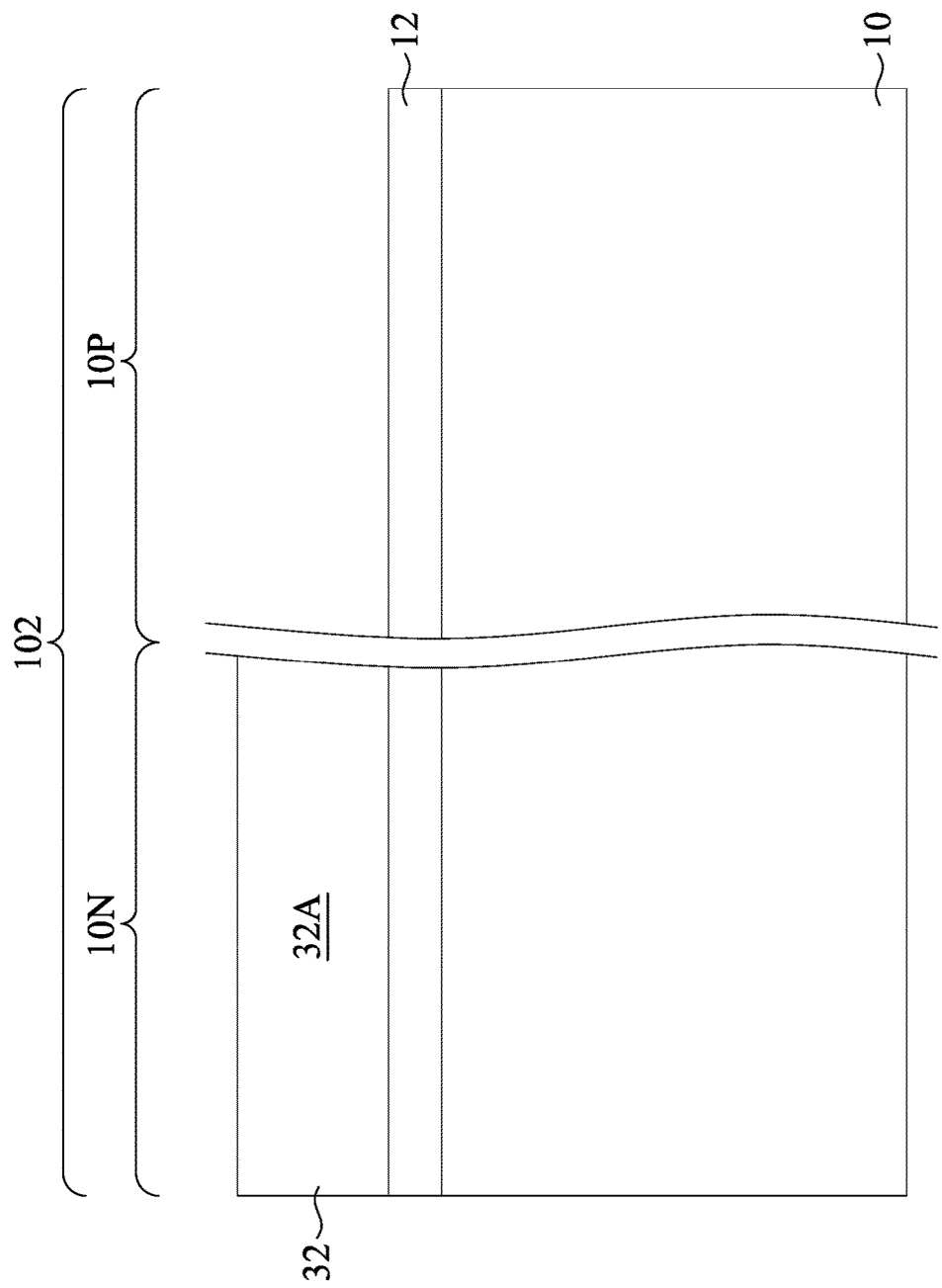
Figure 7B:
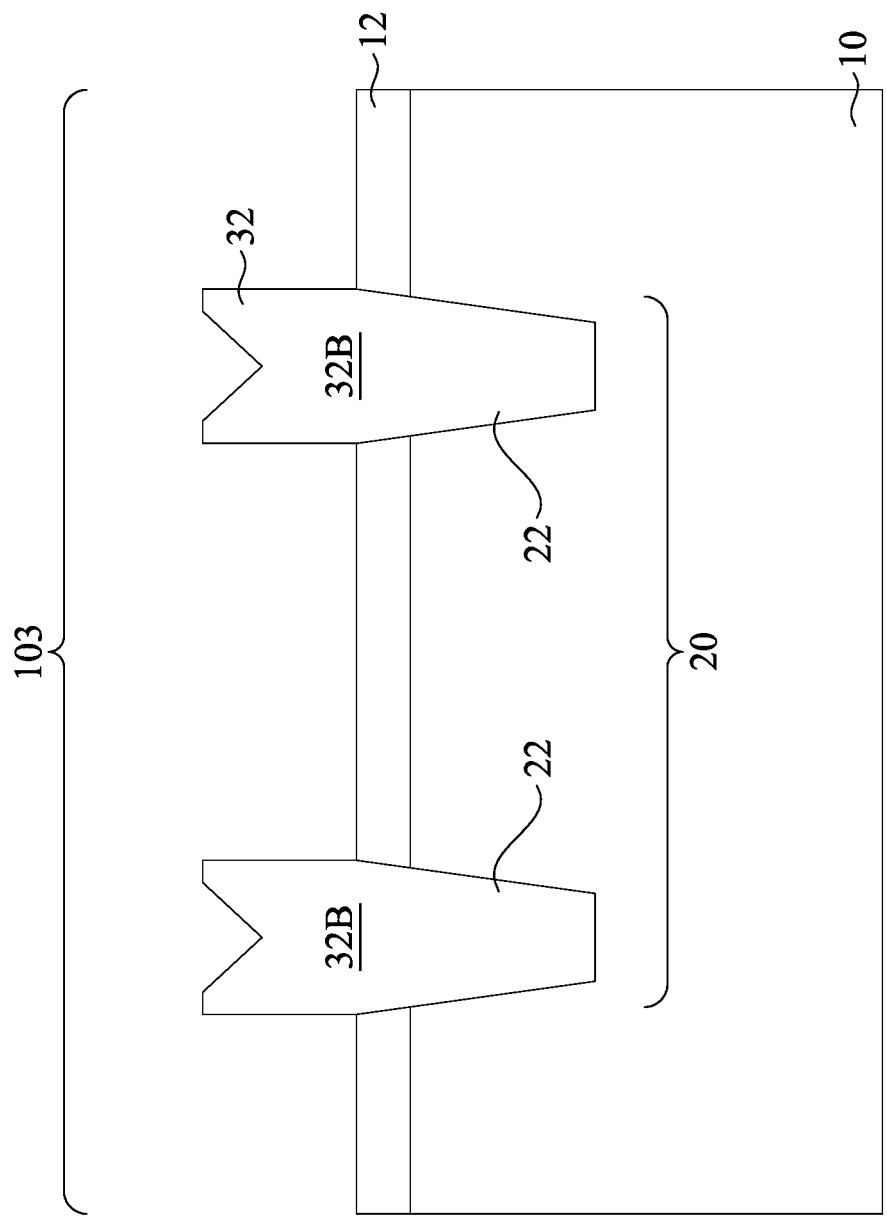

Thereafter, in some embodiments, the second lithography step is performed, where the second lithography step may include forming a photoresist layer over the substrate 10, exposing the photoresist layer according to a pattern of a photomask, performing post-exposure bake processes, and developing the photoresist layer to form a patterned photoresist layer 32. In some embodiments, as illustrated in FIGS. 7A and 7B, the patterned photoresist layer 32 has a first portion 32A in the chip region 102 and a second portion 32B in the dicing region 103. The second portion 32B of the patterned photoresist layer 32 may be deposited over the trenches 22 and has protrusions that align to the trenches 22 and protrude over the substrate 10. The second portion 32B of the patterned photoresist layer 32 may be used to infer the exact position of the first portion 32A of the patterned photoresist layer 32 (e.g., N-type implant mask) in the chip region 102. For example, the position shift of the first portion 32A of the patterned photoresist layer 32 in the chip region 102 may be inferred by measuring the overlay position shift between the second portion 32B of the patterned photoresist layer 32 and the substrate alignment structure 20.

After the patterned photoresist layer 32 is formed, an ion implantation process is performed into the P-type region 10P to form the N-type well, while the N-type region 10N remains masked by the patterned photoresist layer 32. By way of example, N-type impurities implanted via the ion implantation process into the N-type well may include arsenic, phosphorous, antimony, or other N-type donor material. After the ion implantation process, the patterned photoresist layer 32 may be removed, for example, by way of a solvent, resist stripper, ashing, or other suitable technique. The N-type impurities may be implanted in the P-type region 10P to a dose of equal to or less than $10^{15}$ cm$^{-2}$, such as between about $10^{12}$ cm$^{-2}$ and about $10^{15}$ cm$^{-2}$. In some embodiments, the N-type impurities may be implanted at an implantation energy of about 1 keV to about 10 keV.

After performing the implantations of the N-type region 10N and the P-type region 10P, an anneal process may be performed to activate the P-type and/or N-type impurities that were implanted. The anneal process may be performed in an atmosphere containing air or oxygen. The anneal process may be performed at a temperature of about 1000° C. to about 1250° C. for about 1 second to about 30 seconds. The first mask layer 12 is removed by a wet etching process after the implantation processes and before or after the anneal process, in accordance with some embodiments.

Figure 8A:
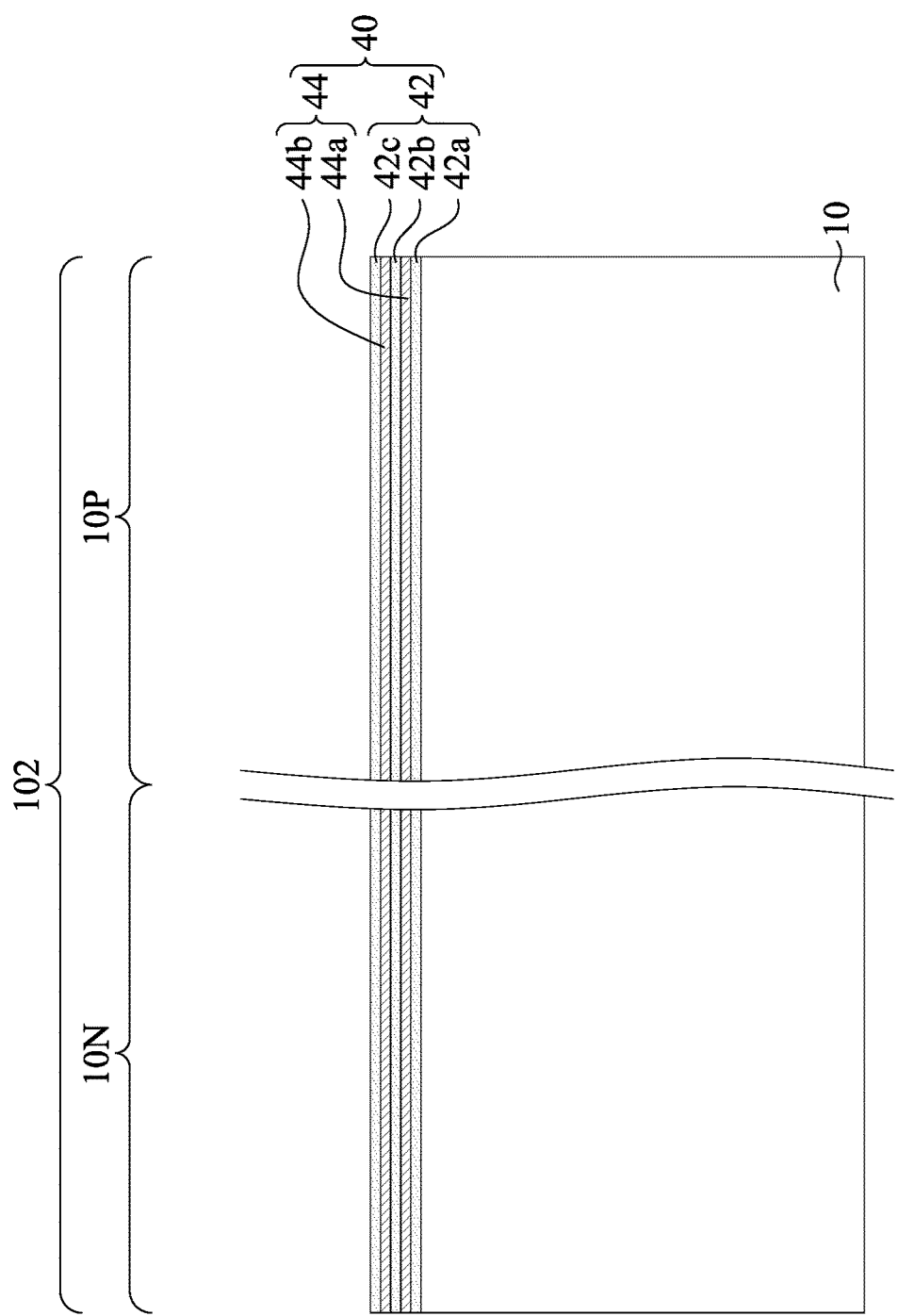
Figure 8B:
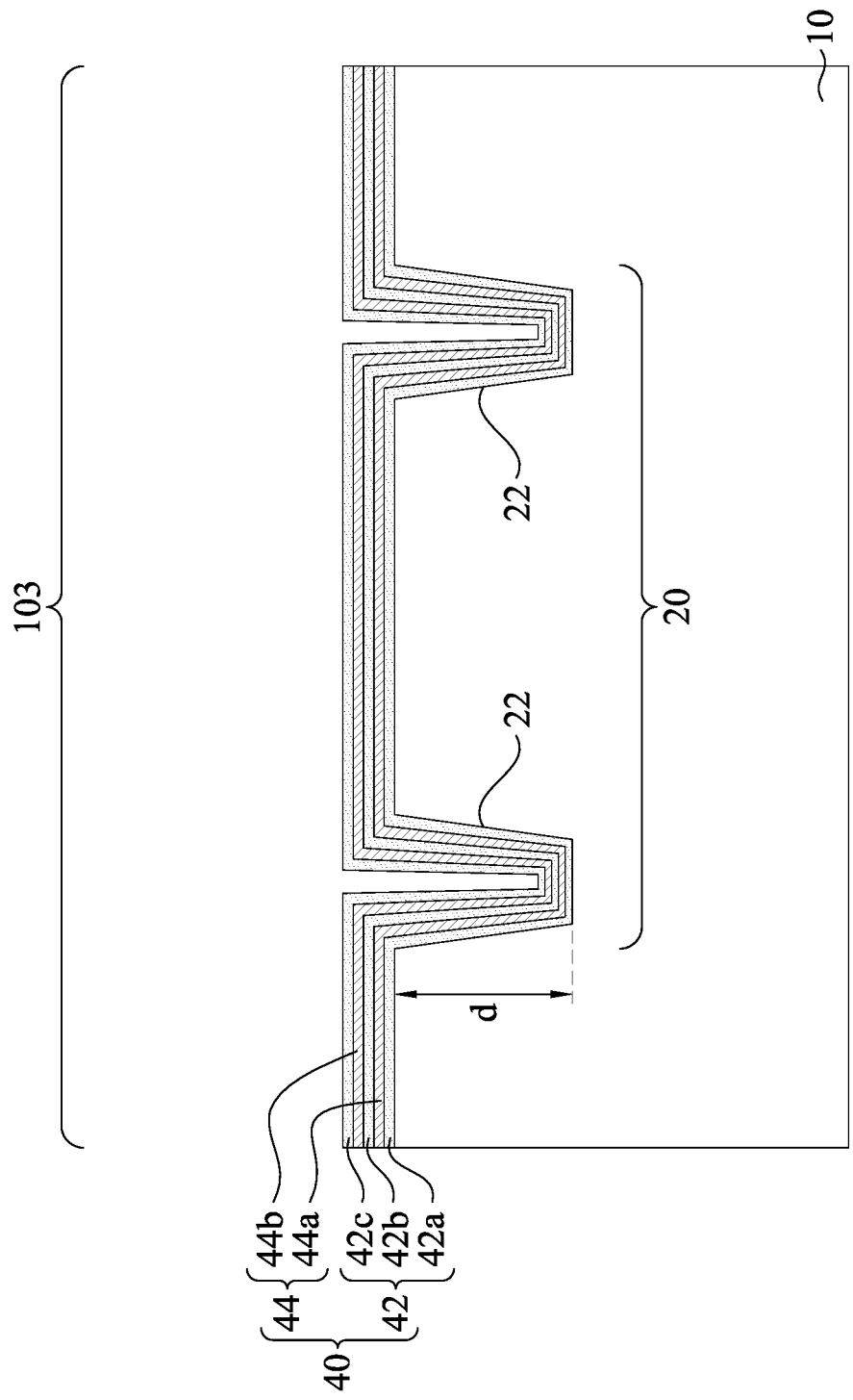

Referring to FIGS. 8A and 8B, a multi-layer stack 40 that includes alternating layers of first semiconductor layers 42a, 42b, 42c (collectively referred to as first semiconductor layer 42) and second semiconductor layers 44a, 44b (collectively referred to as second semiconductor layer 44) are formed over the substrate 10 and in the trenches 22 in accordance with some embodiments. In the FIGS. 8A and 8B, the multi-layer stack 40 is illustrated as including three layers of the first semiconductor layers 42a, 42b, 42c and two layers of the second semiconductor layers 44a, 44b stacked alternately for illustrative purposes. The number of layers of the first semiconductor layer 42 and the second semiconductor layer 44 illustrated in FIGS. 8A and 8B are merely non-limiting examples. Other numbers of layers are also possible and are fully intended to be included within the scope of the present disclosure.

Each layer of the multi-layer stack 40 may be epitaxially grown by rapid thermal chemical vapor deposition (RT-CVD), metal-organic chemical vapor deposition (MOCVD), vapor phase epitaxy (VPE), molecular beam epitaxy (MBE), or other suitable methods. For example, in an embodiment that the first semiconductor layer 42a is the bottom layer of the alternating layers, as illustrated in FIGS. 8A and 8B, the first semiconductor layer 42a is epitaxially grown from the upper surface of the substrate 10 and in the trenches 22; the second semiconductor layer 44a is epitaxially grown over the upper surface of the first semiconductor layer 42a; another first semiconductor layer 42b is epitaxially grown over the upper surface of the second semiconductor layer 44a; and other semiconductor layers are alternately epitaxially grown over the first semiconductor layer 42b. In some embodiments, the first semiconductor layers 42a, 42b, 42c and the second semiconductor layers 44a, 44b are conformally formed over the substrate 10 and in the trenches 22, thereby having profiles substantially the same or similar to the profile of trenches 22 (i.e., substrate alignment structure 20).

In some embodiments, the first semiconductor layer 42 is formed of a first semiconductor material that has a different material from that of the substrate 10. In some embodiments, the first semiconductor material further has a bandgap lower than about 1.1 eV. For example, the first semiconductor material may be silicon-germanium, where the germanium atomic concentration may be from about 20% to about 70%. In some embodiments, each of the first semiconductor layers 42a, 42b, 42c has a thickness range of about 1 nm to about 50 nm. In some embodiments, the second semiconductor layer 44 is formed of a second semiconductor material different from that of the first semiconductor layer 42. Also, the first semiconductor material and the second semiconductor material may be materials having a high-etch selectivity to one another. As such, the first semiconductor layer 42 of the first semiconductor material may be removed without significantly removing the second semiconductor layer 44 of the second semiconductor material, or vice versa, in the subsequent processes. In some embodiments, the second semiconductor layer 44 and the substrate 10 have the same material. In some embodiments, the second semiconductor layer 44 is formed of silicon, silicon carbon, or the like. Each of the second semiconductor layers 44a, 44b has a thickness of about 1 to about 50 nm in accordance with some embodiments.

Figure 9A:
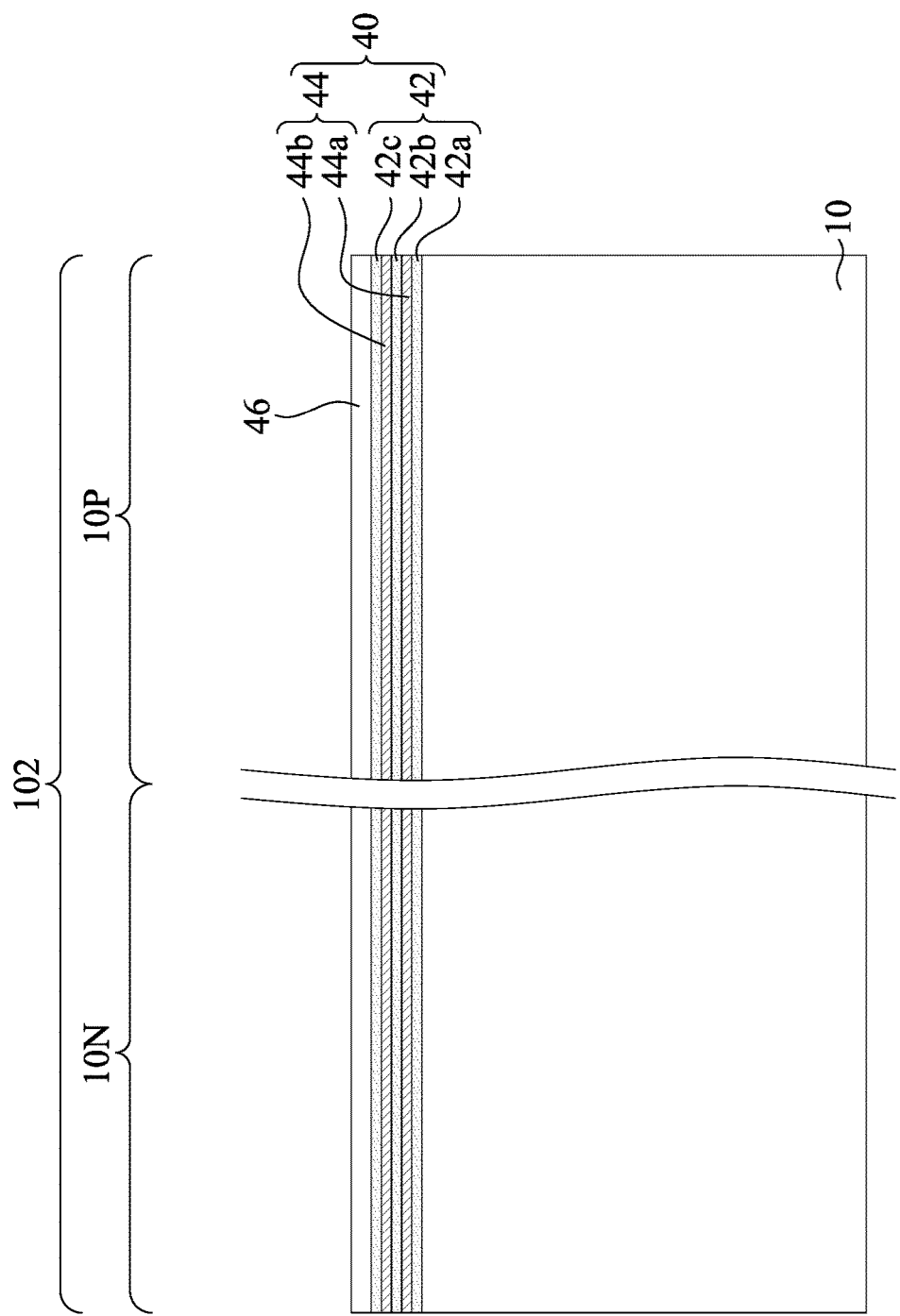
Figure 9B:
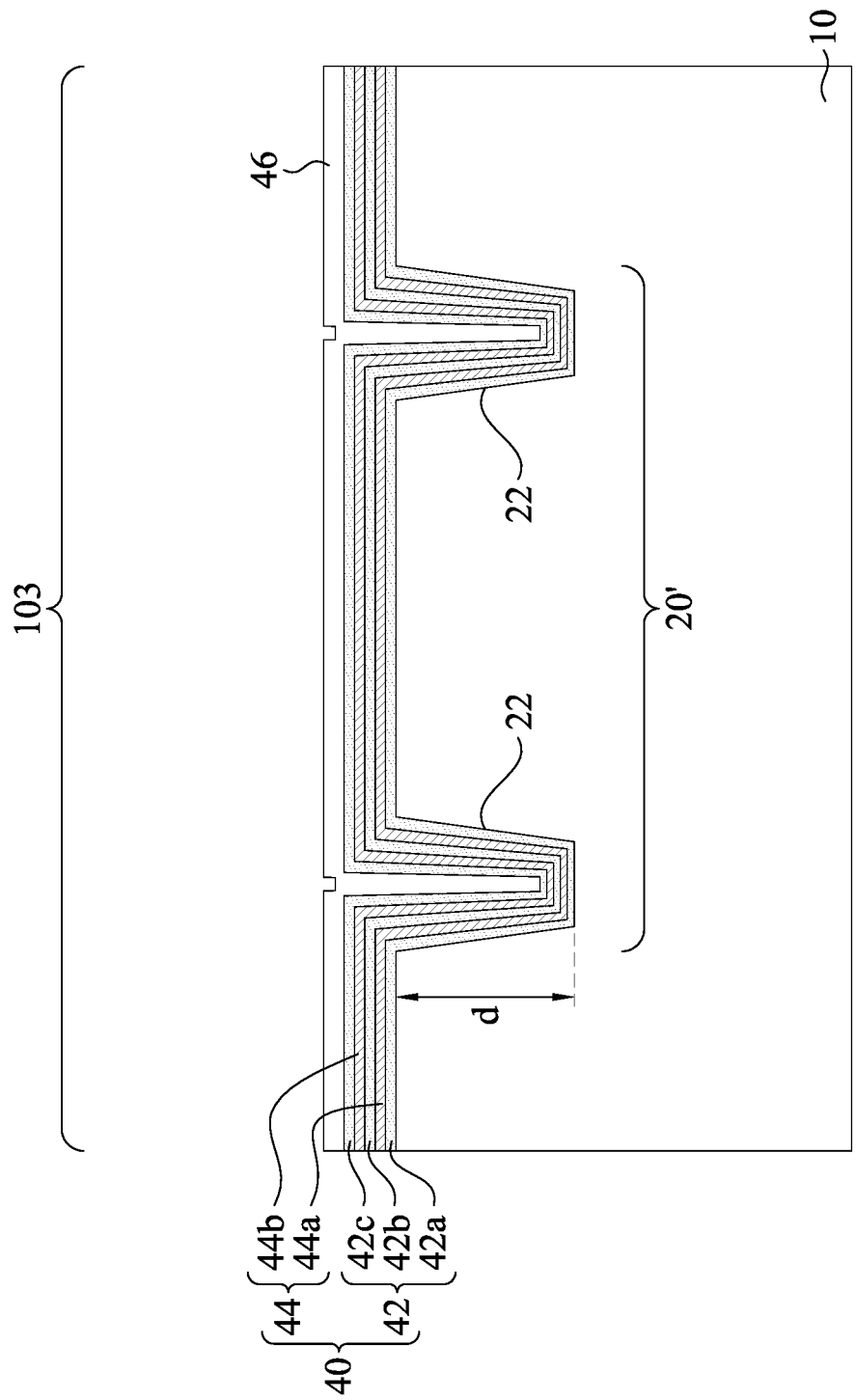

In FIGS. 9A and 9B, a third semiconductor layer 46 is formed over the multi-layer stack 40 in accordance with some embodiments. As illustrated in FIGS. 9B, the multi-layer stack 40 may not completely fill the trenches 22, and the trenches 22 may be filled by the third dielectric layer 46. The third semiconductor layer 46 may be formed of the second semiconductor material and may be formed by the same methods of forming the second semiconductor material. In some embodiments, the third semiconductor layer 46 has a thickness that is thick enough to fill the trenches 22 completely. For example, the third semiconductor layer 46 may have a thickness of about 1 to about 100 nm.

Figure 10A:
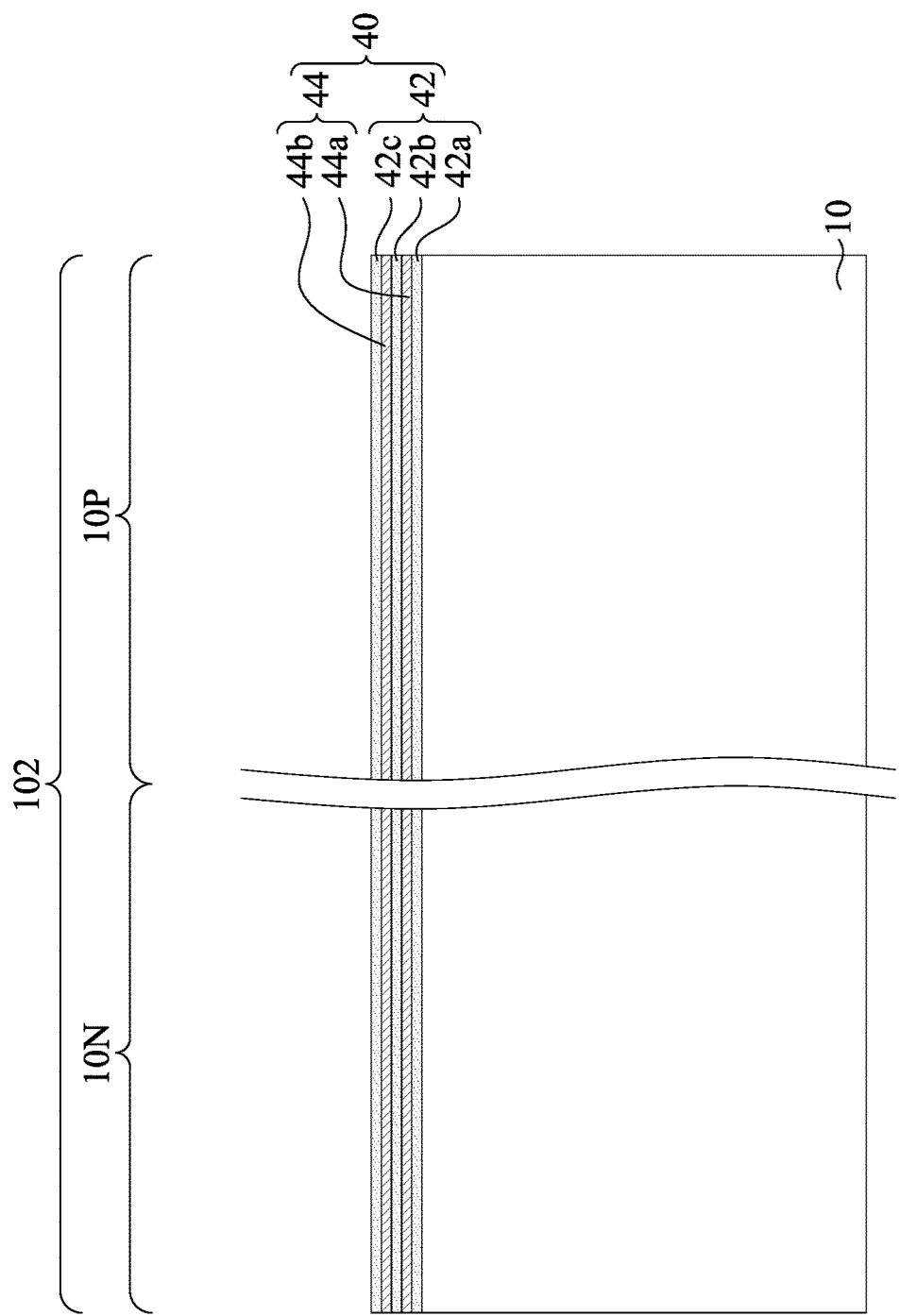
Figure 10B:
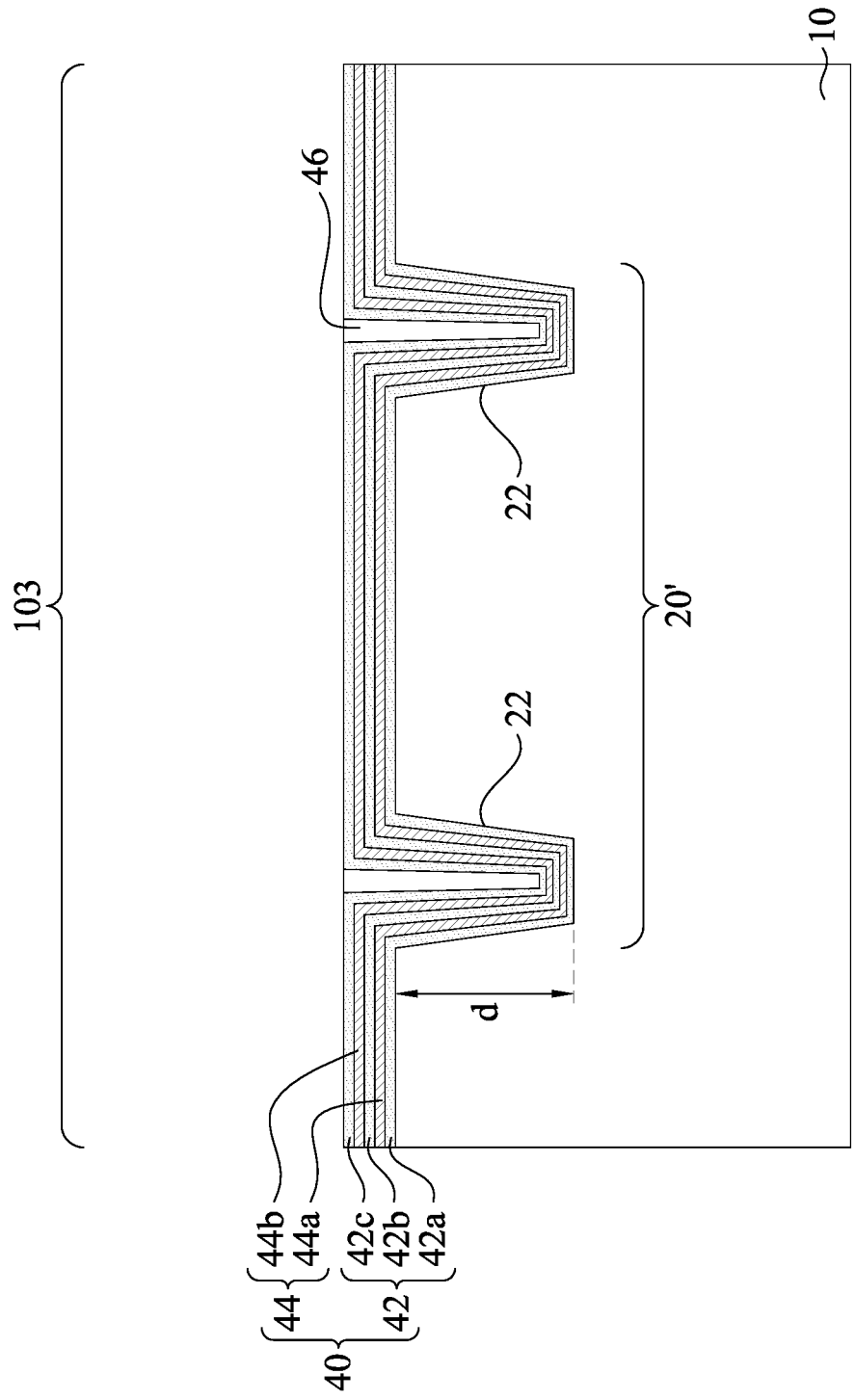

Referring to FIGS. 10A and 10B, a planarization process is performed. In some embodiments, the planarization process includes a chemical mechanical polishing (CMP) process or any other suitable etching process. The planarization process removes the third semiconductor layer 46 outside the trenches 22 in accordance with some embodiments. For example, a portion of the third semiconductor layer 46 outside the trenches in the dicing region 103 and all the third semiconductor layer 46 in the chip region 102 are removed, exposing the multi-layer stack 40 and leaving a substantially flat upper surface of the third semiconductor layer 46 in the trenches 22. As illustrated in FIGS. 10A and 10B, such flat upper surface of the third semiconductor layer 46 may be substantially level with the upper surface of the multi-layer stack 40 outside the trenches, such as the level with the upper surface of the first semiconductor layer 42c outside the trenches 22. In some embodiments, the first semiconductor layer 42c may be used as a polishing stop layer in the embodiments illustrated in FIGS. 10A and 10B. In this context, the trenches 22 and the semiconductor layers 42, 44, 46 filled in and over the trenches 22 in the dicing region 103 are collectively referred to as an alignment structure 105.

Figure 11:
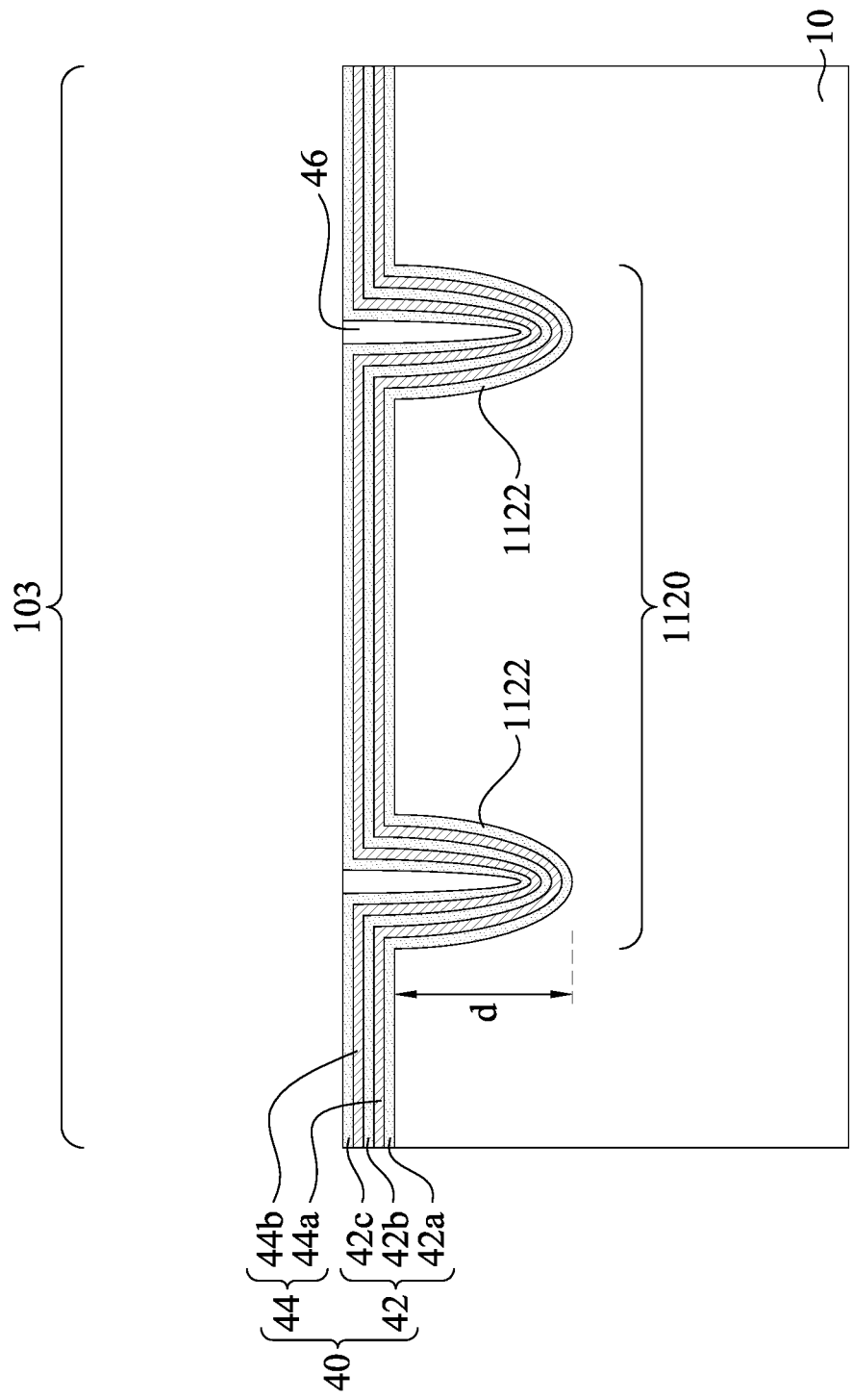
Figure 20:
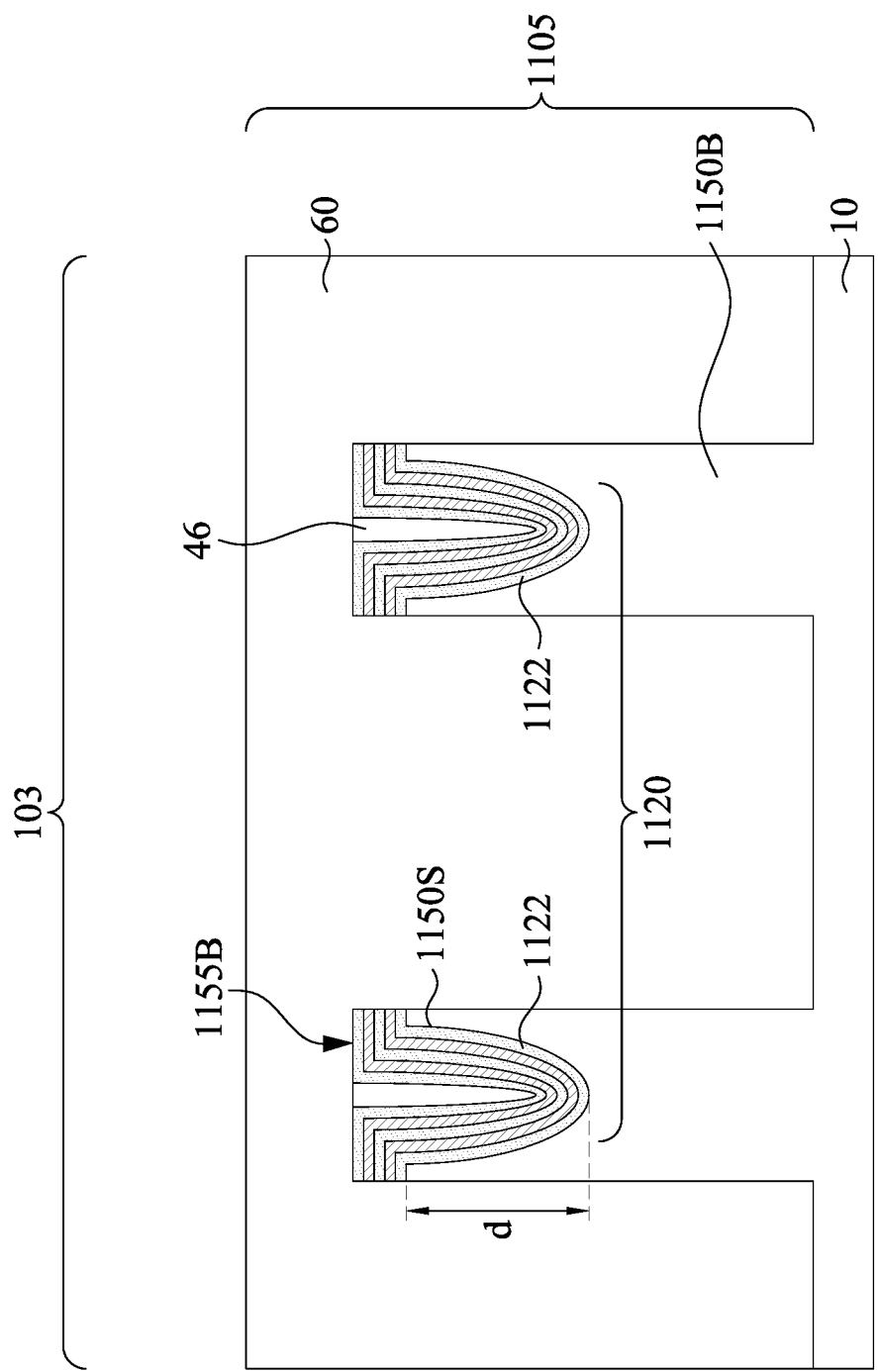

It is noted that, in some embodiments, an anneal process is performed for rounding the bottom corners of the trenches 22 before the multi-layer stack 40 is formed. The anneal process may cause the trenches 1122 have rounded corners. The rounded corners may mitigate or avoid from stacking fault from occurring in the alternating layers of the multi-layer stack 40 or between the multi-layer stack 40 and the third semiconductor layer 46. For example, FIG. 11 shows an alignment structure 1120 formed with the rounded trenches 1122. The alignment structure 1105 may include semiconductor layers 42, 44, 46 formed with the rounded trenches 1122. The anneal process for rounding the corners of the trenches 1122 is performed in an atmosphere containing $H_2$ or a mixture of $H_2$ and $N_2$ in accordance with some embodiments. For example, the anneal process is performed under $H_2$ or a mixture of $H_2$ and $N_2$. In some embodiments, the anneal process for rounding the corners of the trenches 1122 is performed at a temperature lower than that of the anneal process for activating the P-type/N-type impurities in P-type/N-type well. In some embodiments, the anneal process for rounding the corners of the trenches 1122 is performed at a temperature of about 700° C. to about 1,200° C. for about 1 second to about 600 seconds. FIG. 20 illustrates a structure resulting from such embodiments with the rounded trenches 1122, for example.

Figure 12A:
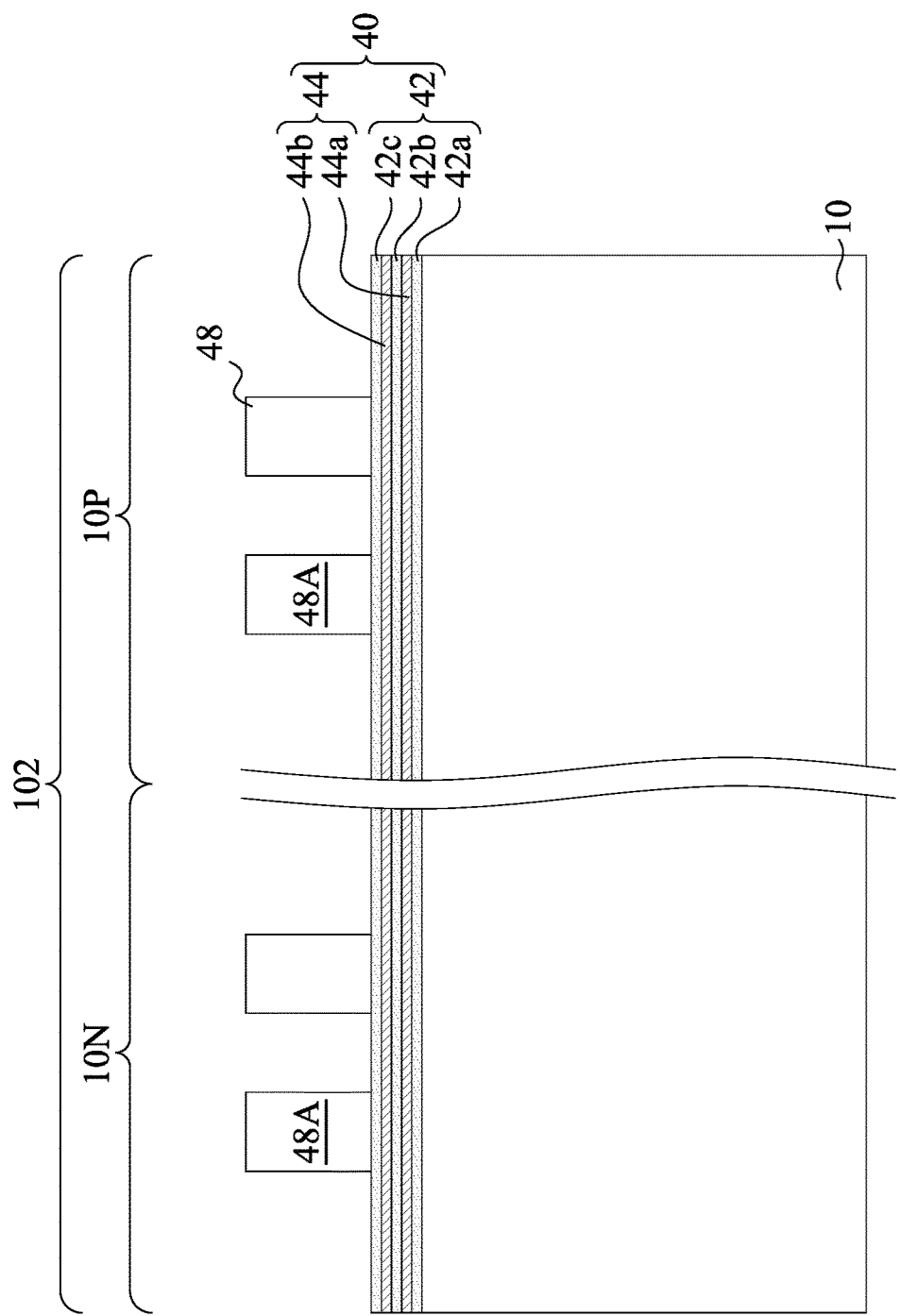
Figure 12B:
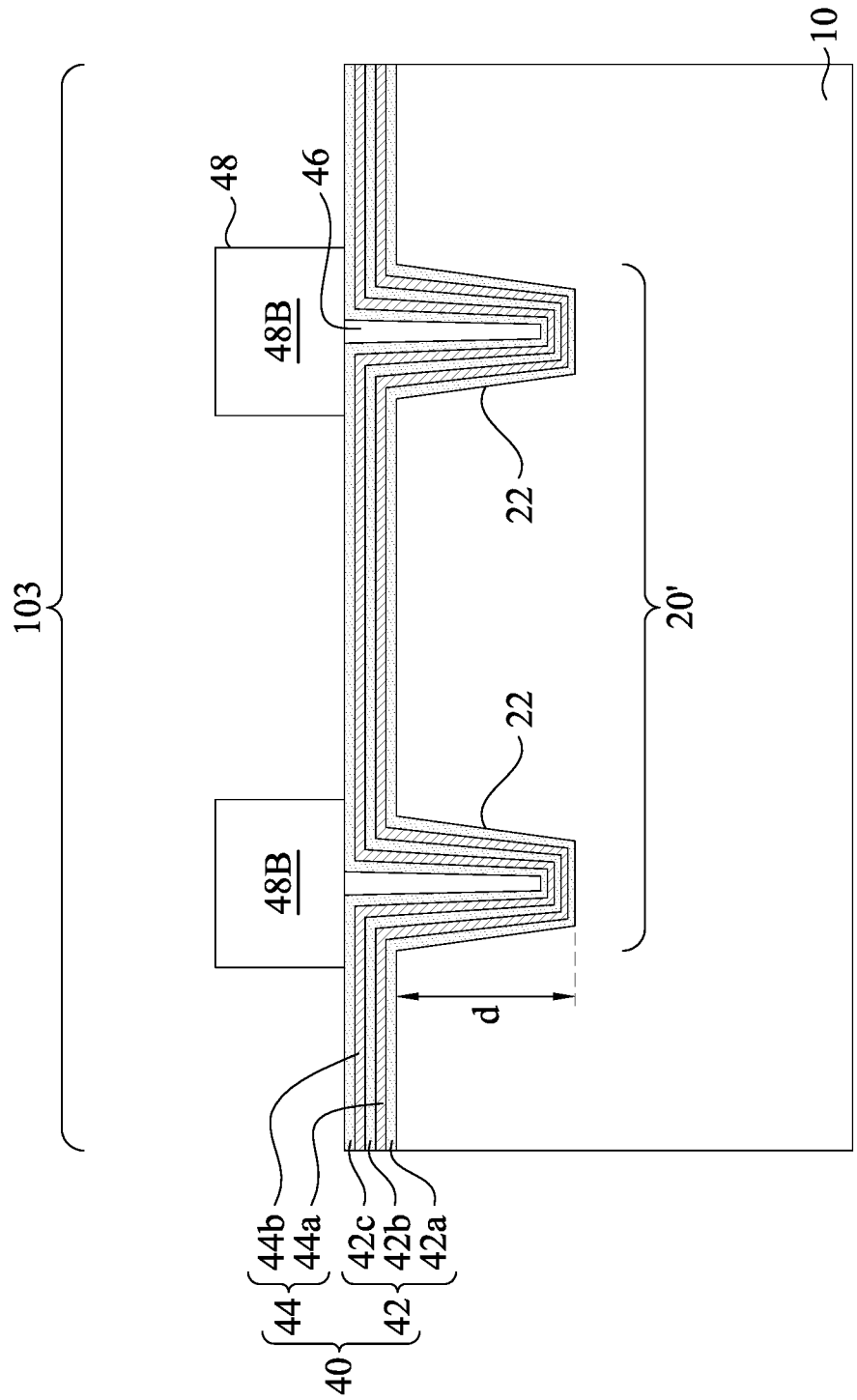

In FIGS. 12A and 12B, a patterned photoresist layer 48 is formed over the multi-layer stack 40 by one or more lithography steps. The lithography step may include forming a photoresist layer over the multi-layer stack 40 in the chip region 102 and the dicing region 103, exposing the photoresist layer according to a pattern of a photomask, performing post-exposure bake processes, and developing the photoresist layer to form a patterned photoresist layer 48. In some embodiments, as illustrated in FIGS. 12A and 12B, the patterned photoresist layer 48 has a first portion 48A in the chip region 102 and a second portion 48B in the dicing region 103. The first portion 48A of the patterned photoresist layer 48 is to define fins 50 and nanostructures 55A in the chip region 102 in accordance with some embodiments. The second portion 48B of the patterned photoresist layer 48 may be deposited over and align to the alignment structure 20'. The second portion 48B of the patterned photoresist layer 48 may be used to infer the exact position of the first portion 48A of the patterned photoresist layer 48 (e.g., the mask to define the fins 50A and nanostructures 55A) in the chip region 102. For example, the position shift of the first portion 48A of the patterned photoresist layer 48 in the chip region 102 may be inferred by measuring the overlay position shift between the second portion 48B of the patterned photoresist layer 48 and the alignment structure 20'. Generally, the lithography process may also be applied in double-patterning or multi-patterning processes or in self-aligned processes. In some embodiments that the measured overlay position shift of the patterned photoresist layer 48 is larger than a predetermined value or the process window, the patterned photoresist layer 48 may be removed, and the steps of forming the patterned photoresist layer 48 may be performed again.

In some embodiments, because the first semiconductor layer 42 and the second semiconductor layer 44 are conformally formed over the substrate 10 and along the trenches 22, the profile of the trenches 22 can be measured by detecting the profile of the first semiconductor layer 42 or the second semiconductor layer 44, thereby the accuracy of profile measurement of the positions of the alignment structures 20' (e.g., the trenches) may be improved as compared to an alignment structure that has a thick layer of semiconductor material (e.g., a silicon layer or silicon oxide) filling in the trenches 22. The thick layer filled in the trenches 22 would interfere with the measurement accuracy and sensitivity of the profile of the trenches 22 because the detecting light used to measure the profile of the trenches 22 would be absorbed by the thick layer, especially when the thick layer and the substrate are formed of similar materials. In some embodiments, forming one or more thin layers (e.g., the first semiconductor layer 42) having a material different from the substrate 10 can mitigate or avoid this problem. For example, in an embodiment that the first semiconductor layer 42a is formed of silicon-germanium and the second and third semiconductor layers 44a, 44b, 46 are formed of silicon, substantially all of the detecting light may penetrate the second and third semiconductor layers 44 and 46 to reach the bottommost layer of the multi-layer stack 40, the first semiconductor layer 42a. Because the first semiconductor layer 42 has a bandgap lower than 1.1 eV, the first semiconductor layer 42 may be detected by a light having a wavelength over about 1.1 um, without being absorbed by the thin silicon layers (e.g., second and third semiconductor layers 44a, 44b, 46) which may be used as channel layers of the nano-FETs. Thus, with the formation of alignment structures 20', accurate profiles of the trenches 22 and accurate overlay position shift between the alignment structures 20' and photoresist patterns that are used to define fins 50 and nanostructures 55 can be measured.

In some embodiments, the first semiconductor layers 42 or the second semiconductor layers 44 may serve as the channel layers of nanostructures in the chip region 102. Thus, the alignment structure 20' may be formed without adding additional layers and may be easily integrated into any semiconductor devices and processes of manufacturing them. In further embodiments, with the formation of the third semiconductor layer 46, the second portion 48B of the patterned photoresist layer 48 may stand on a flat upper surface, which may reduce the possibility of pattern deformation because depositing on an uneven surface.

Figure 13A:
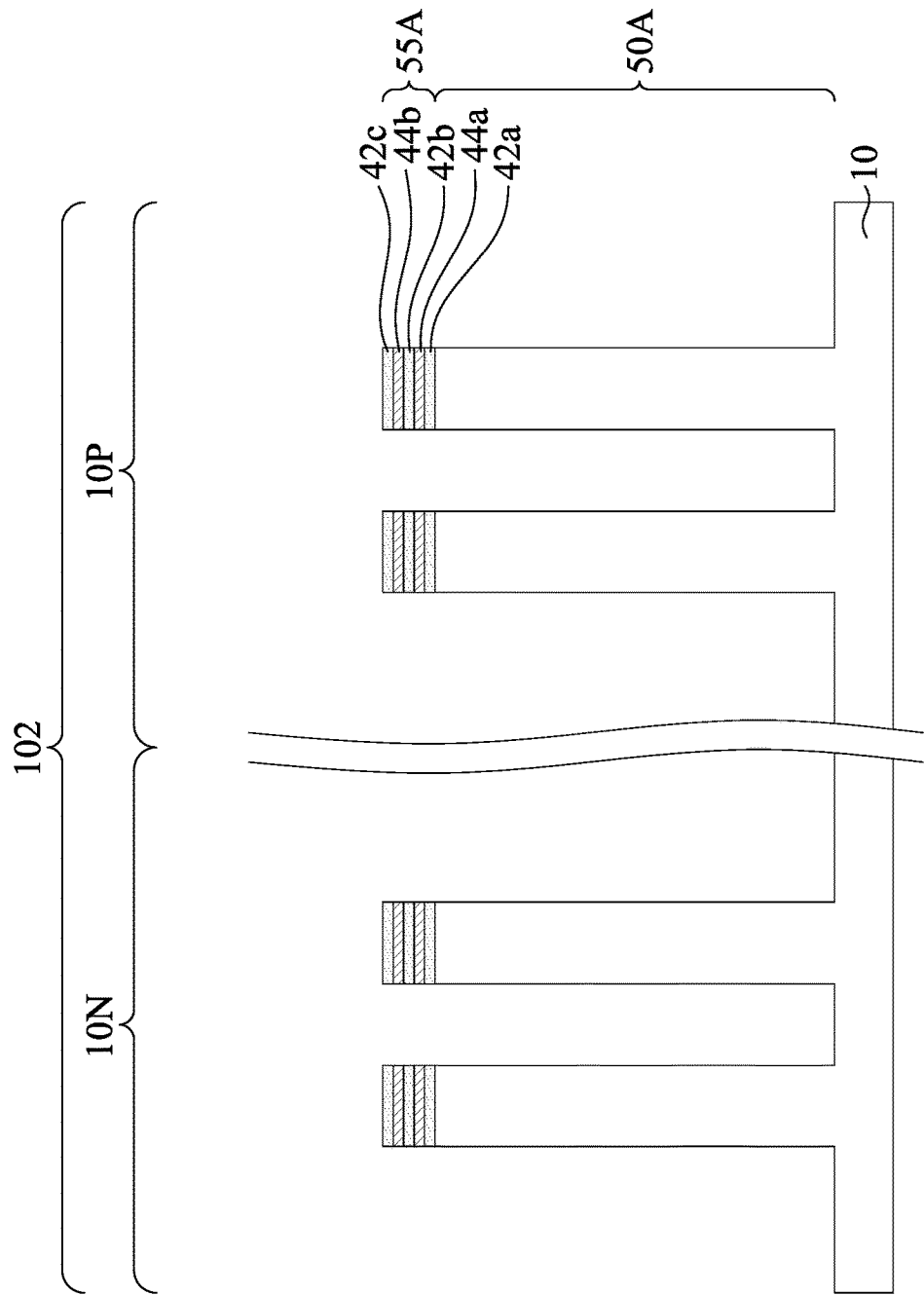
Figure 13B:
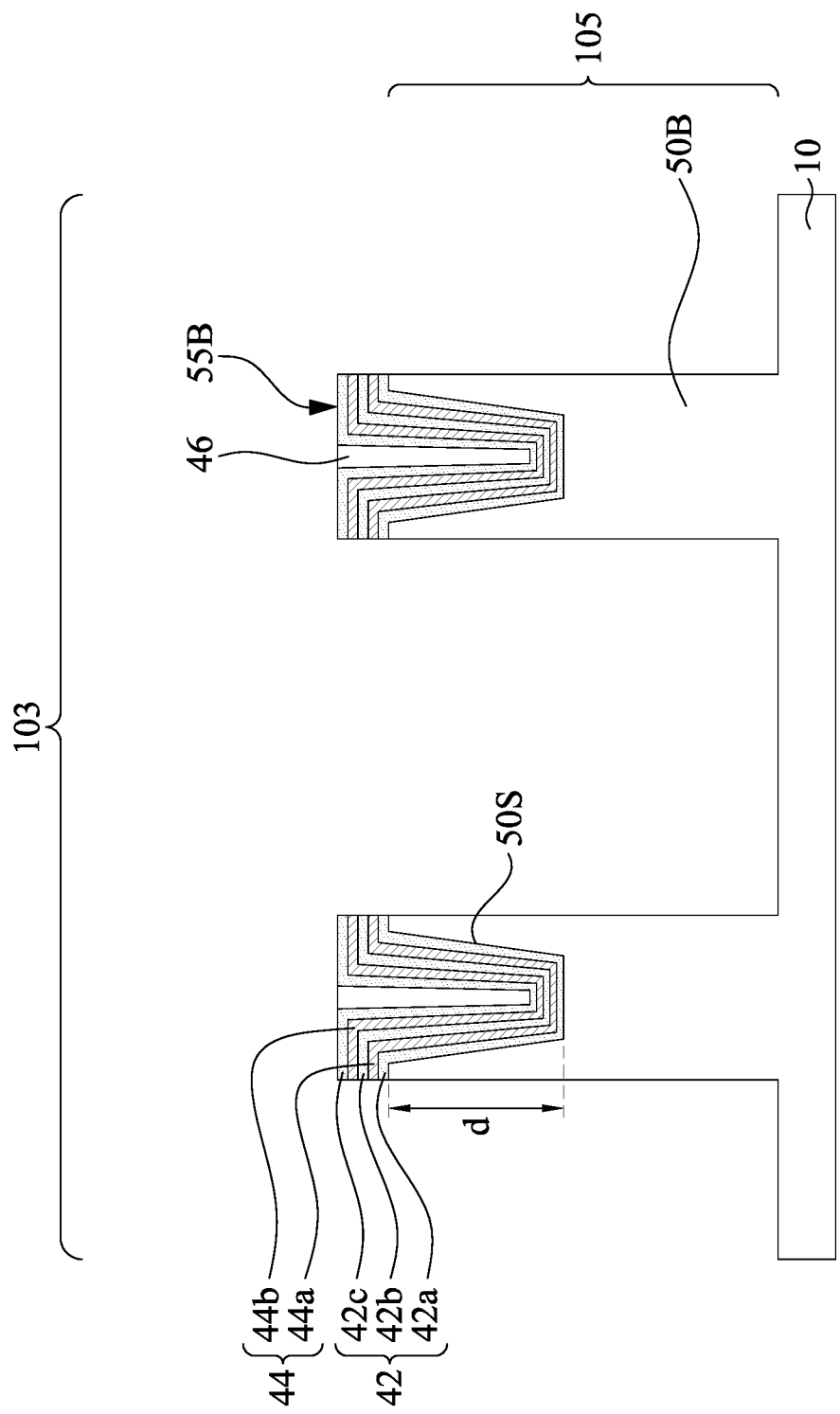

In FIGS. 13A and 13B, the fins 50A and nanostructures 55A in the chip region 102 and the fins 50B and nanostructures 55B in the dicing region 103 are formed by a patterning process in accordance with some embodiments. The fins 50A, 50B and nanostructures 55A, 55B may be formed by etching the substrate 10 according to the patterns of the first portion 48A and the second portion 48B of the patterned photoresist layer 48. In FIG. 13A, each of the fins 50A have a substantially flat upper surface, and respective nanostructures 55A including the first and second semiconductor layers 42, 44 are disposed over the flat upper surface of the fins 50A, in accordance with some embodiments. The fins 50A may be formed from the substrate 10 and have the same material as the substrate 10. It is noted that, in FIG. 13A, the fins 50A and nanostructures 55A having substantially equal widths are for illustrative purposes. In some embodiments, widths of the fins 50A in the N-type region 10N may be greater or thinner than the fins 50A in the P-type region 10P. Further, while each of the fins 50A and the nanostructures 55A are illustrated as having a consistent width throughout, in other embodiments, the fins 50A and/or the nanostructures 55A may have tapered sidewalls such that a width of each of the fins 50A and/or the nanostructures 55A continuously increases in a direction towards the substrate 10. In such embodiments, fins 50A and respective nanostructures 55A over the fins 50A may have a different width and be trapezoidal in shape.

In FIG. 13B, the trenches 22 are disposed over corresponding ones of the fins 50B in accordance with some embodiments. Each of the fins 50B may have an upper surface that is equal to the profile of the trenches 22. For example, each of the fins 50B may have a concave upper surface 50S. The concave upper surface 50S may have the depth d of about 50 nm to about 250 nm, or about 80 nm to about 100 nm. In some embodiments, because the semiconductor layers 42, 44 and 46 are formed in the trenches 22, the first semiconductor layer 42, the second semiconductor layer 44, and the bottom surface of the nanostructures 55B are conformal to the concave upper surface 50S of the fins 50B. The fins 50B may be formed from the substrate 10 and have the same material as the substrate 10. In some embodiments, the patterned photoresist layer 48 may be removed, for example, by way of a solvent, resist stripper, ashing, or other suitable technique. In the context, the nanostructures 55B and the fins 50B are collectively referred to as the alignment structure 105.

Figure 14A:
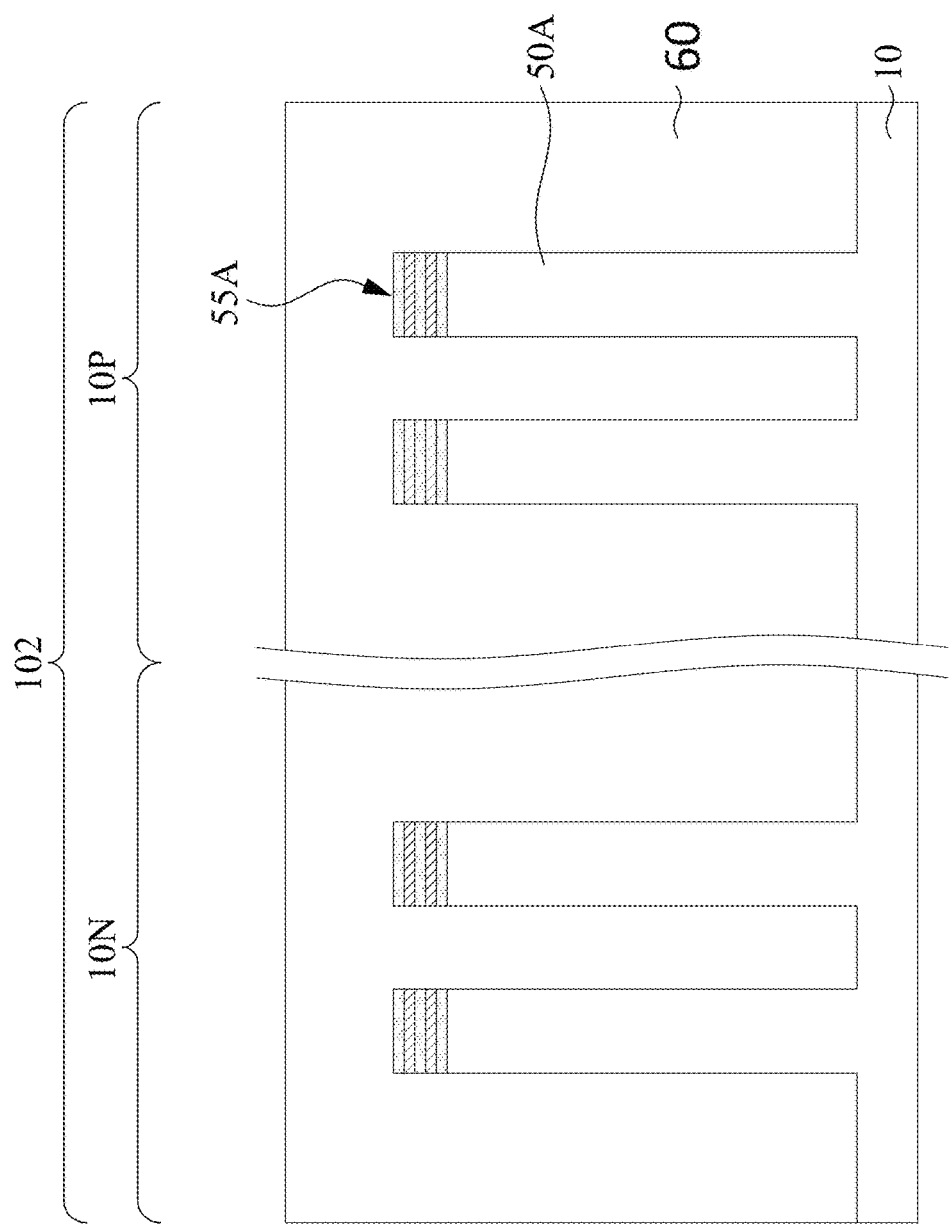
Figure 14B:
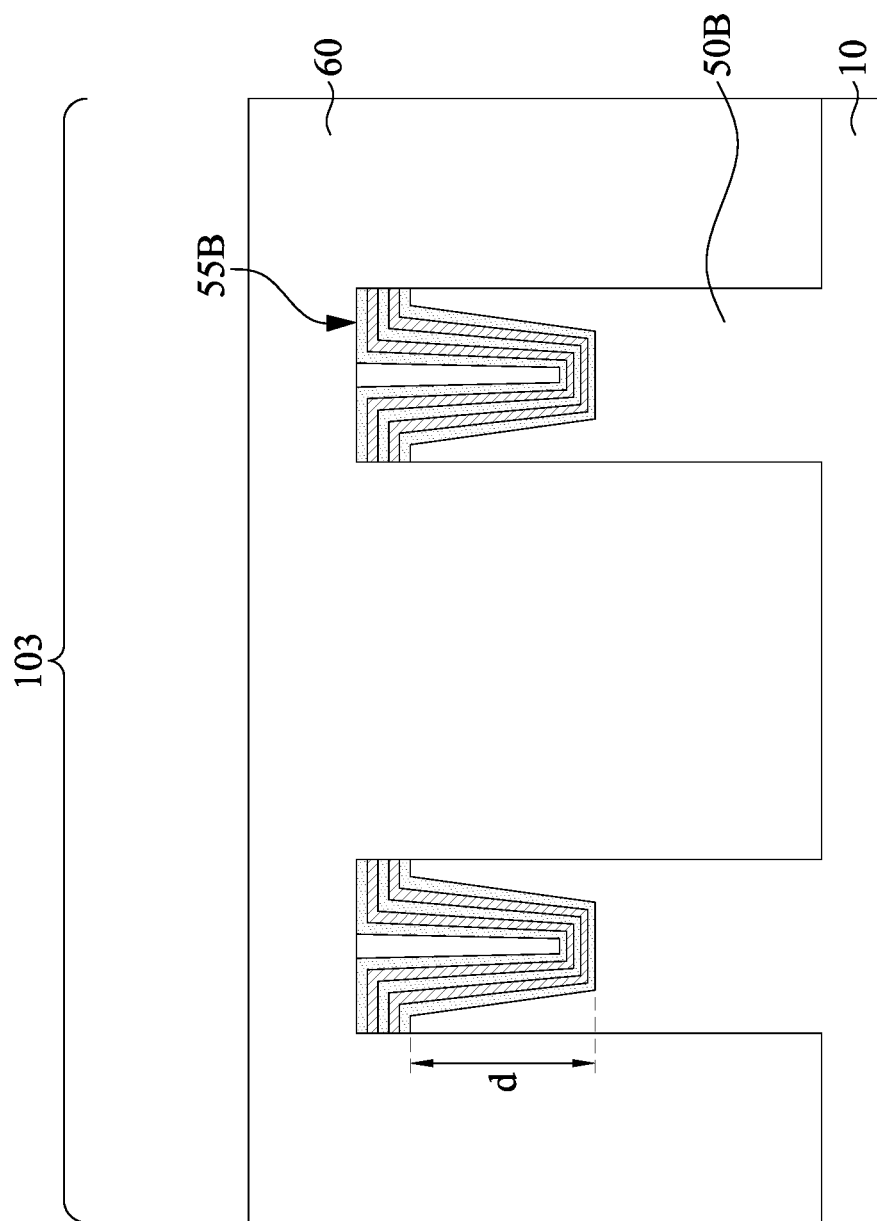

In FIGS. 14A and 14B, an insulation layer 60 is deposited over the substrate 10, the fins 50A, 50B and the nanostructures 55A, 55B. The insulation layer 60 may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation layer 60 is formed. Although the insulation material is illustrated as a single layer, some embodiments may utilize multiple layers. For example, in some embodiments, a liner (not separately illustrated) may first be formed along a surface of the substrate 10, the fins 50A and 50B, and the nanostructures 55A and 55B. Thereafter, a fill material, such as those discussed above, may be formed over the liner.

Figure 15A:
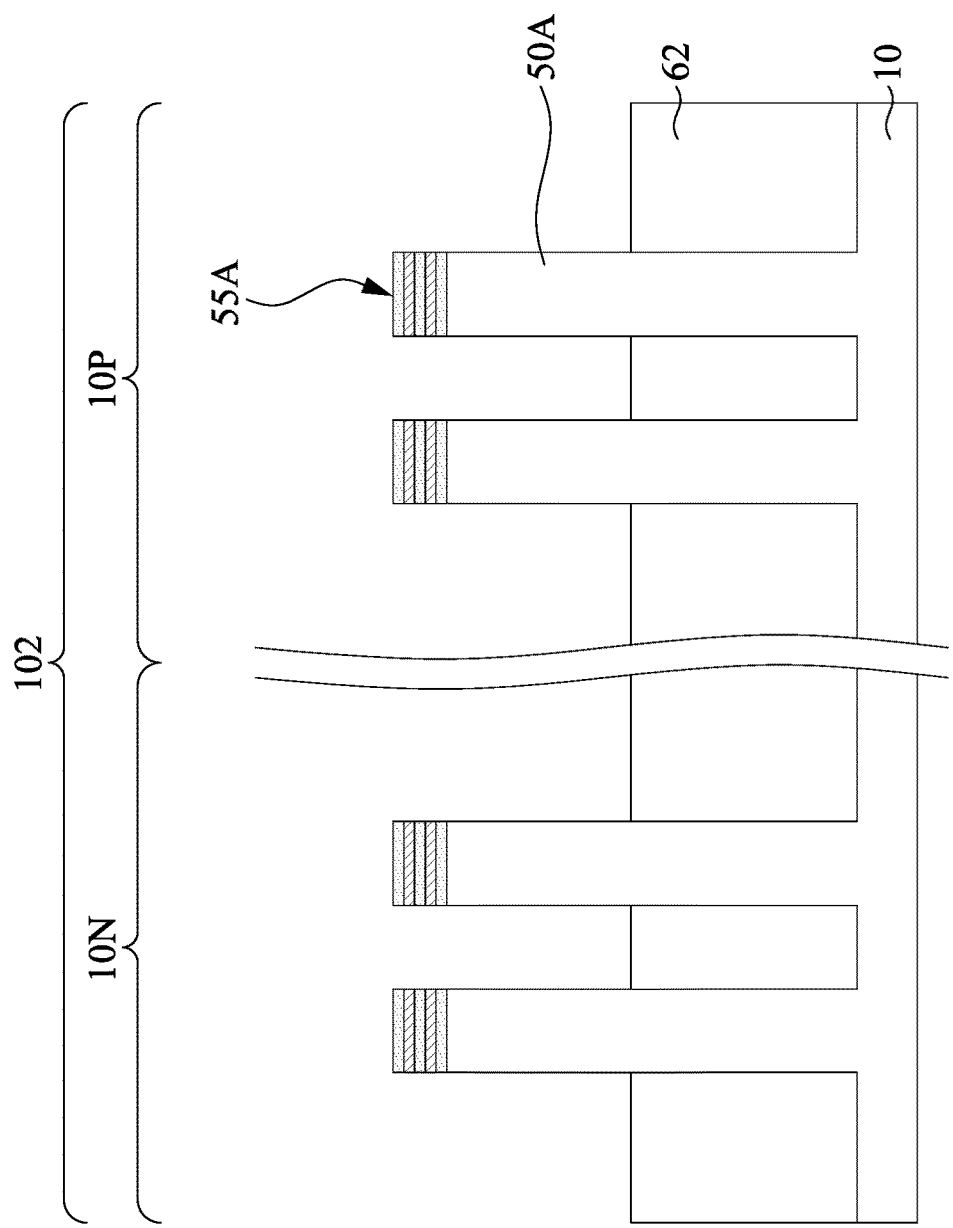
Figure 15B:
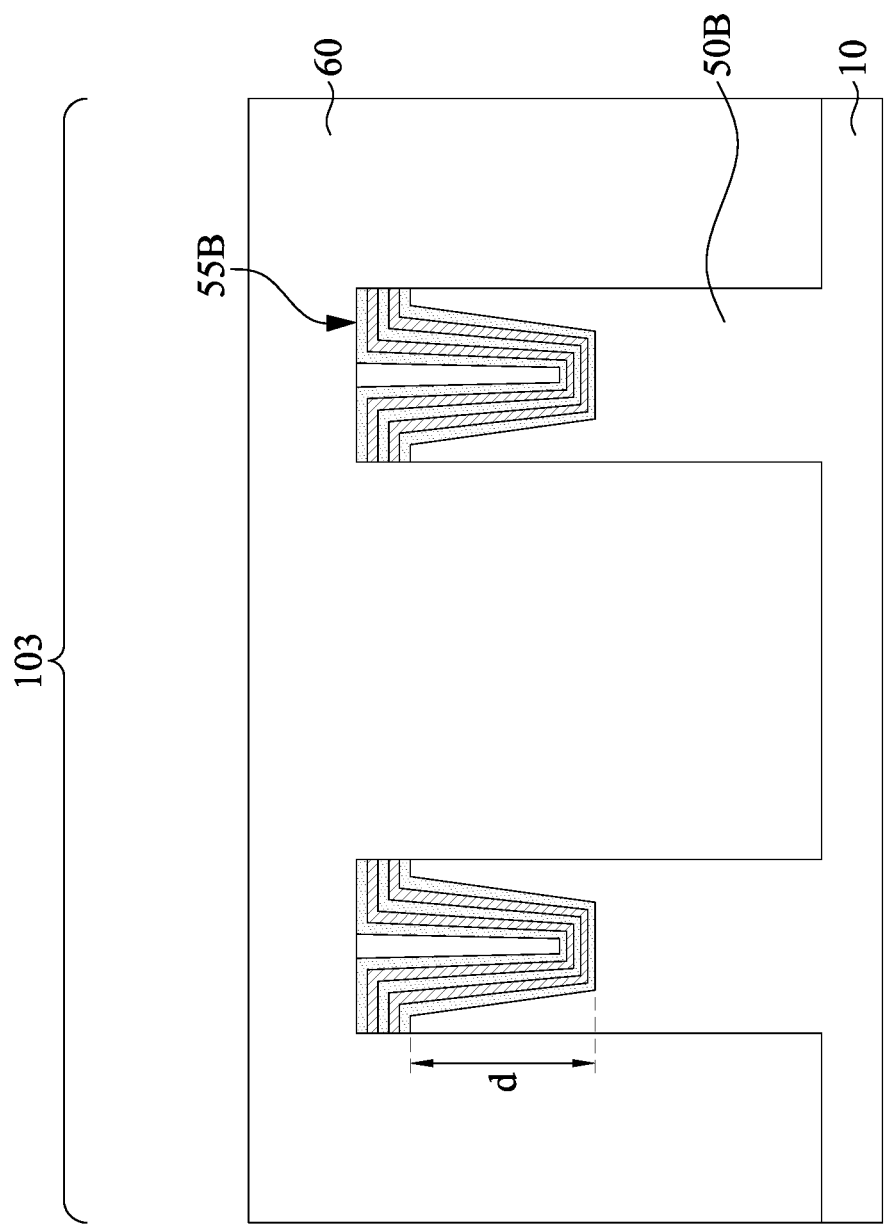

In FIGS. 15A and 15B, a removal process is applied to the insulation layer 60 in the chip region 102 to form isolation features 62 adjacent the fins 50A. In some embodiments, the isolation features 62 are shallow trench isolation (STI) features. The removal process includes removing excess insulation layer 60 over and adjacent the nanostructures 55A in the chip region 102 while not removing the insulation layer 60 over and adjacent the nanostructures 55B in the dicing region 103 in accordance with some embodiments. In some embodiments, the removal process may be an etch-back process or a combination of the etch-back process and a CMP process. In some embodiments, a photoresist layer may be applied over the dicing region 103, while exposing the chip region 102 before the removal process is performed.

Figure 16A:
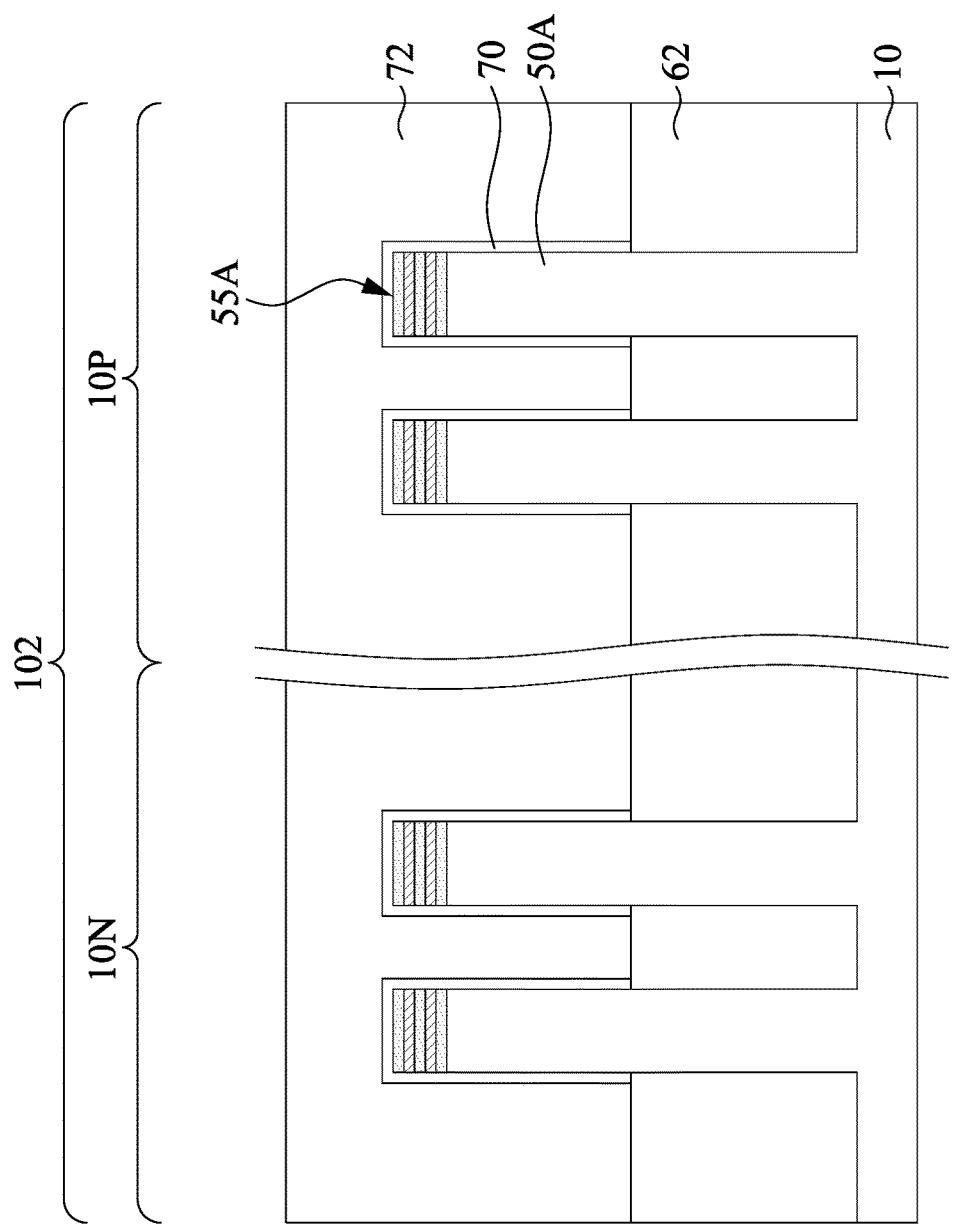
Figure 16B:
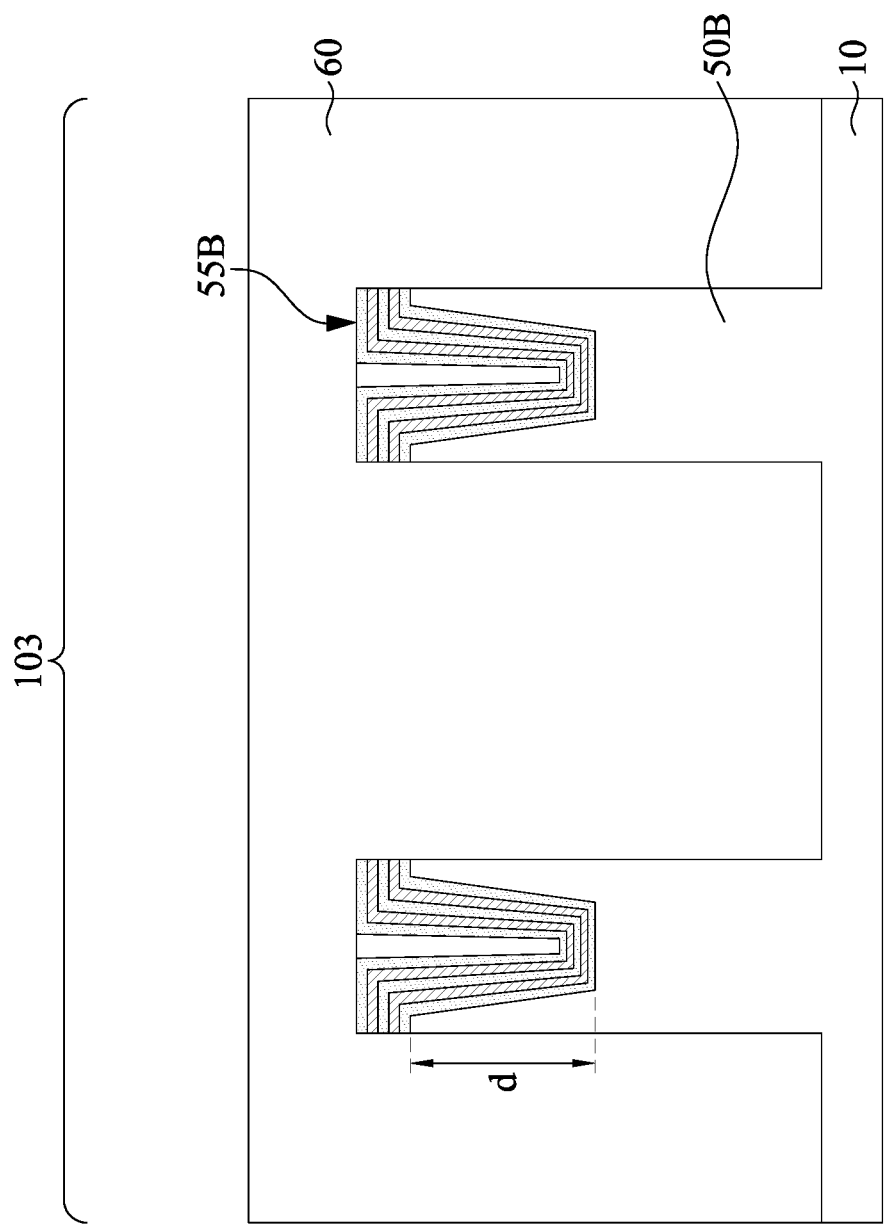
Figure 17:
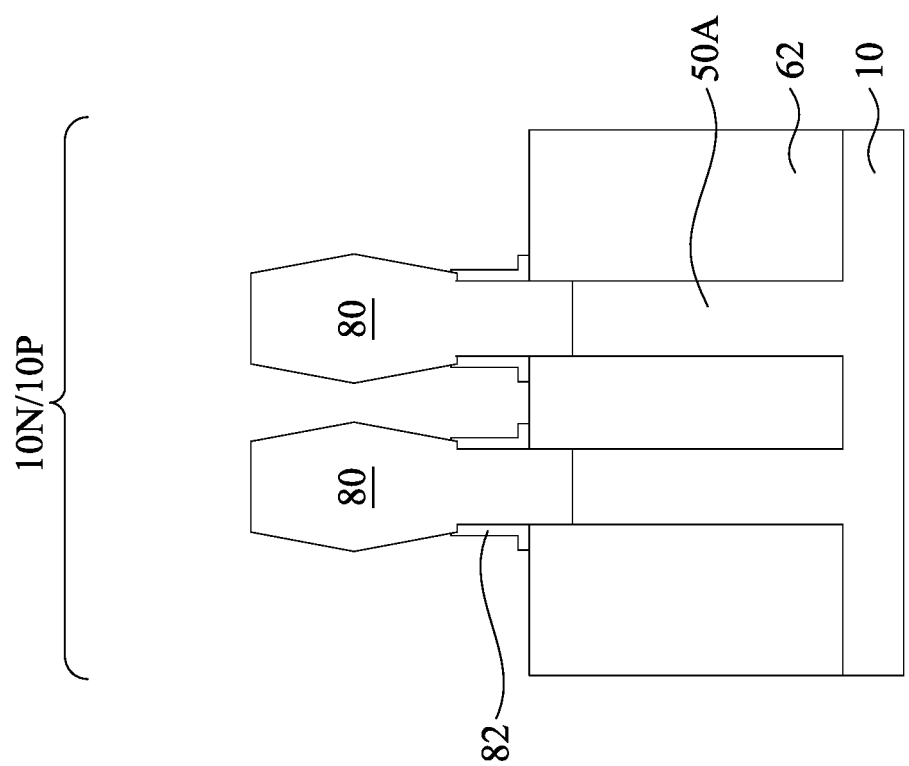

In FIGS. 16A and 16B, a dummy dielectric layer 70 is formed over the fins 50A and/or the nanostructures 55A in the chip region 102. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70. The dummy gate layer 72 may be deposited over the dummy dielectric layer 70 and then planarized, such as by a CMP. The dummy gate layer 72 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching the isolation features 62. It is noted that the dummy dielectric layer 70 is shown covering only the fins 50A and the nanostructures 55A for illustrative purposes only. In some embodiments, the dummy dielectric layer 70 may be deposited such that the dummy dielectric layer 70 covers the isolation features 62, such that the dummy dielectric layer 70 extends between the dummy gate layer 72 and the isolation features 62.

Referring to FIG. 17, source/drain features 80 are then formed on opposite sides of the nanostructures 55A. In some embodiments, the source/drain features 80 are formed by epitaxially growing a semiconductor material layer from the substrate 10 on opposite sides of the nanostructures 55A. In some embodiments, portions of the fins 50A and nanostructures 55A that are not covered by the dummy gate layer 72 are etched to create recesses between the isolation features 62. In some embodiments, the source/drain features 80 are epitaxially grown in the recesses and over the isolation features 62, as illustrated in FIG. 17. In some examples, dummy sidewall spacers (not shown in Figures) may be formed prior to epitaxial source/drain growth and removed after epitaxial source/drain growth. Additionally, in some embodiments, the main sidewall spacers 82 may be formed, as described above, after epitaxial source/drain growth. In some embodiments, the source/drain features 80 may be formed in P-type region 10P to provide a PMOSFET, and the source/drain features 80 include materials exerting a tensile strain in the channel regions, such as silicon, SiC, SiCP, SiP, or the like. In some embodiments, the source/drain features 80 may be formed in the N-type region 10N to provide a NMOSFET, and the source/drain features 80 include materials exerting a compressive strain in the channel regions, such as SiGe, SiGeB, Ge, GeSn, or the like. The source/drain features 80 may have surfaces raised from respective surfaces of the fins and may have facets. In some embodiments, after the formation of the source/drain features 80, an anneal process may be performed to activate the impurities in the source/drain features 80. As illustrated in FIG. 17, source/drain features 80 are separated from each other in accordance with some embodiments. In other embodiments, some of the source/drain features 80 may be merged or physically connected to each other.

Figure 18A:
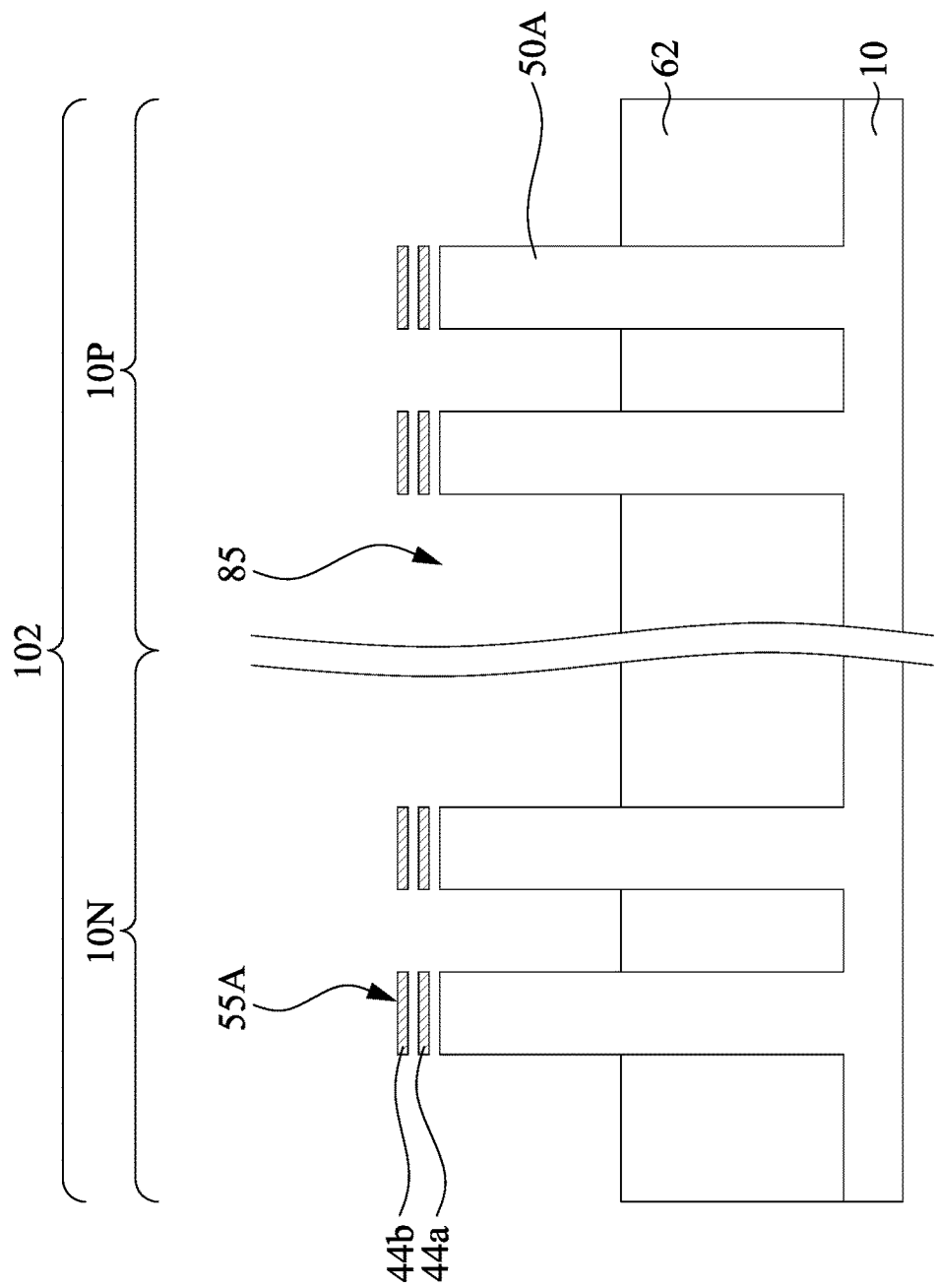
Figure 18B:
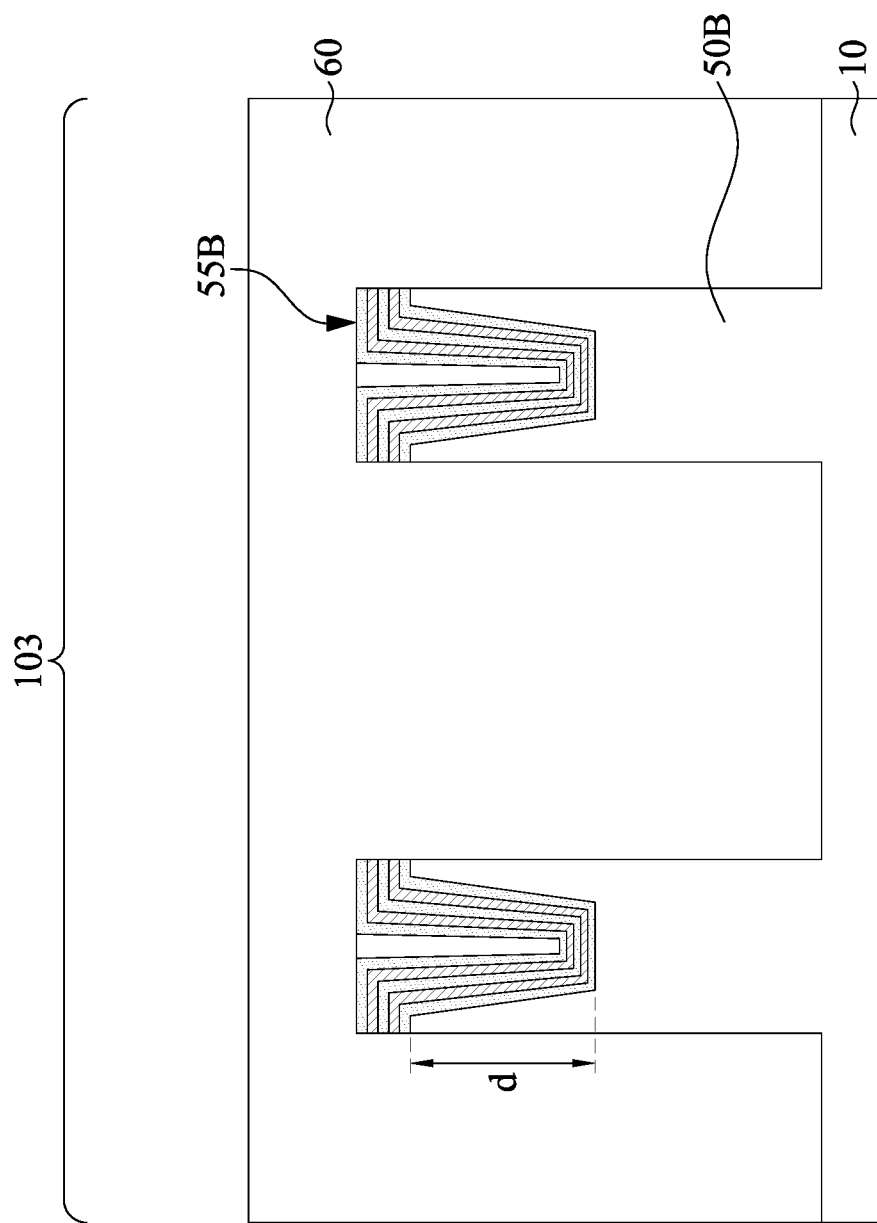

In FIGS. 18A and 18B, the dummy gate layer 72 are removed in one or more etching steps so that recesses 85 are formed in the chip region 102. Portions of the dummy dielectric layer 70 in the recesses 85 are also removed. In some embodiments, the dummy gate layer 72 and the dummy dielectric layer 70 are removed by an anisotropic dry etch process. For example, the etching process may include a dry etch process using reaction gas(es) such as reactive ion etching. Each recess 85 exposes and/or overlies the nanostructures 55A in the chip region 102. During the removal, the dummy dielectric layer 70 may be used as etch stop layer when the dummy gate layer 72 are etched. The dummy dielectric layer 70 may then be removed after the removal of the dummy gate layer 72.

In FIGS. 18A and 18B, the first semiconductor layer 42 in the chip region 102 may be removed, and the second semiconductor layer 44 in the chip region 102 may remain and will act as channel regions of nano-FETs in both N-type region 10N and P-type region 10P. In such embodiments, the channel regions in both N-type region 10N and P-type region 10P may have the same material composition (e.g., silicon or another semiconductor material). Tetramethylammonium hydroxide (TMAH), ammonium hydroxide (NH$_4$OH), or the like may be used to remove the first semiconductor layer 42.

In other embodiments, the second semiconductor layer 44 in the N-type region 10N and the P-type region 10P will be removed (not shown in Figures). Also, the first semiconductor layer 42 in the N-type region 10N and the P-type region 10P will act as channel regions of nano-FETs in both P-type region 10P and N-type region.

Figure 19A:
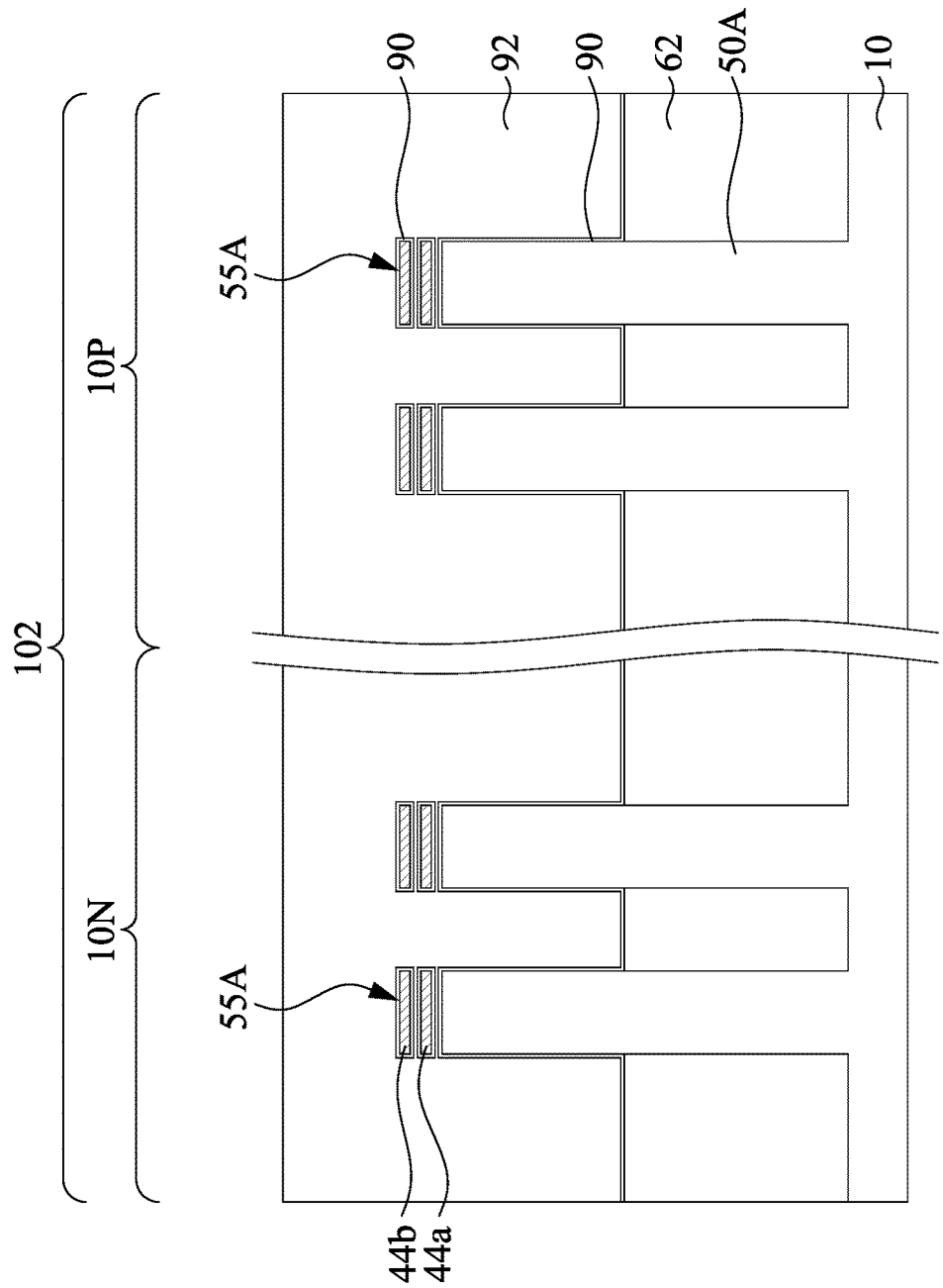
Figure 19B:
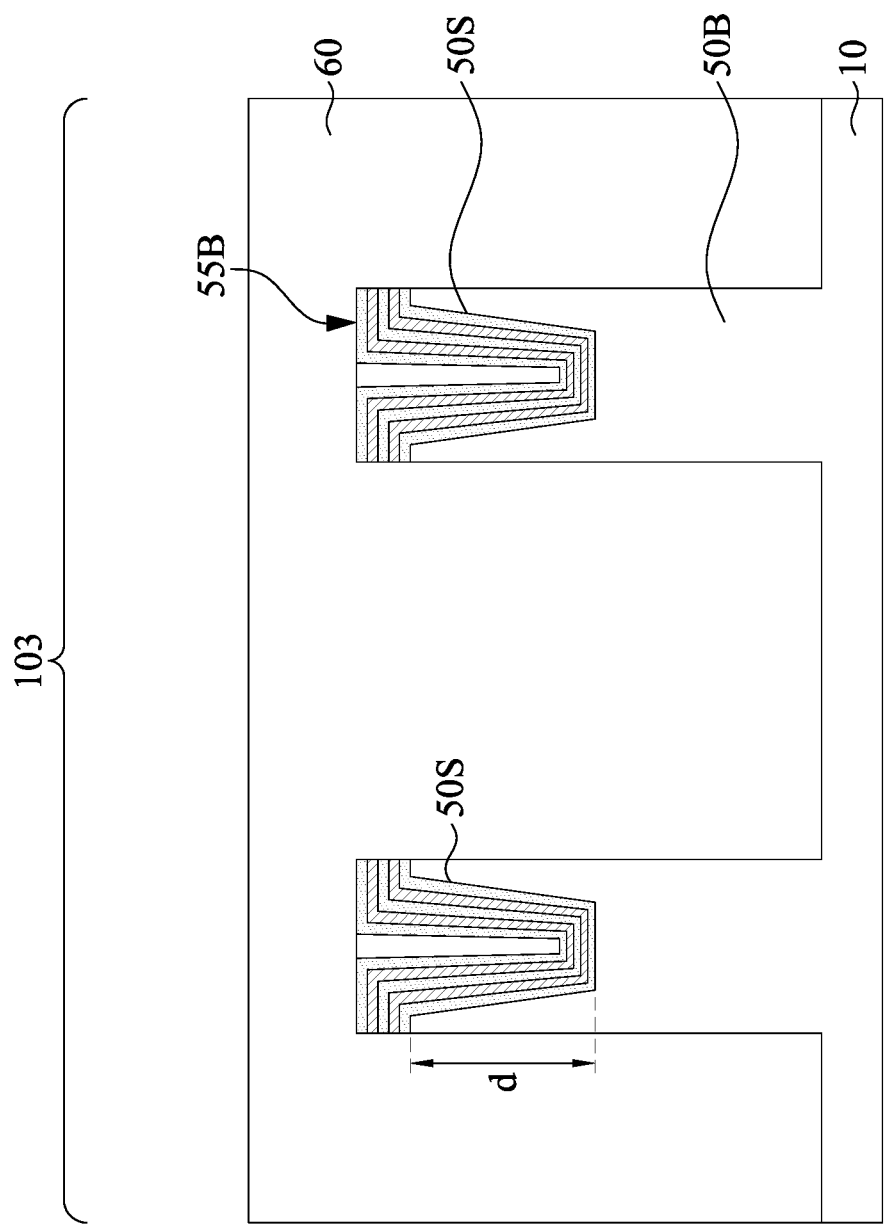

In FIGS. 19A and 19B, gate dielectric layers 90 and gate electrodes 92 are formed for replacement gates. The gate dielectric layers 90 is deposited conformally in the recesses 85. In the illustrated example, the gate dielectric layers 90 may be formed on top surfaces and sidewalls of the fins 50A and on top surfaces, sidewalls, and bottom surfaces of nanostructures 55A, for example, on the top surfaces, sidewalls, and bottom surfaces of second semiconductor layer 44.

In accordance with some embodiments, the gate dielectric layers 90 includes one or more dielectric layers, such as an oxide, a metal oxide, the like, or combinations thereof. For example, in some embodiments, the gate dielectric layers 90 may include a silicon oxide layer and a metal oxide layer over the silicon oxide layer. In some embodiments, the gate dielectric layers 90 includes a high-k dielectric material, and in these embodiments, the gate dielectric layers 90 may have a k value greater than about 7.0, and may include a metal oxide or a silicate of hafnium, aluminum, zirconium, lanthanum, manganese, barium, titanium, lead, and combinations thereof. The formation methods of the gate dielectric layers 90 may include molecular-beam deposition (MBD), ALD, PECVD, and the like.

The formation of the gate dielectric layers 90 in the N-type region 10N and the P-type region 10P may occur simultaneously such that the gate dielectric layers 90 in N-type region 10N and the P-type region 10P are formed from the same materials, and the formation of the gate electrodes 92 may occur simultaneously such that the gate electrodes 92 in the N-type region 10N and the P-type region 10P are formed from the same materials. In some embodiments, the gate dielectric layers 90 in the N-type region 10N and the P-type region 10P may be formed by distinct processes, such that the gate dielectric layers 90 may have different materials and/or have a different number of sub-layers, and/or the gate electrodes 92 in the N-type region 10N and the P-type region 10P may be formed by distinct processes, such that the gate electrodes 92 may have different materials and/or have a different number of sub-layers in the N-type region 10N and the P-type region 10P. Various masking steps may be used to mask and expose appropriate regions when using distinct processes.

After the filling of the recesses 85, a planarization process, such as a CMP, may be performed to remove the excess portions of the gate dielectric layers 90 and the gate electrodes 92. The remaining portions the gate electrodes 92 and the gate dielectric layers 90 thus form replacement gate structures of the resulting nano-FETs. The gate electrodes 92 and the gate dielectric layers 90 may be collectively referred to as "gate structures."

FIG. 20 illustrates a cross-sectional view according to the section C-C' of the nano-FETs illustrated in FIG. 2, in accordance with some alternative embodiments. In FIGS. 20, like reference numerals indicate like elements formed by like processes as the structure of FIGS. 3A through 19B. For example, the nano-FETs in these embodiments may have an alignment structure 1105, and each of the alignment structures 1105 may comprise nanostructures 1155B disposed over a fin 1150B. The nanostructures 1155B are similar to the nanostructures 55B as those discussed above, and the fin 1150B is similar to the fin 50B as those discussed above, where the fin 1150B has a rounded concave upper surface 1150S. The nanostructures 1155B has a bottom surface conformal to the rounded concave upper surface 1150S. The rounded concave upper surface 1150B may mitigate or avoid from stacking fault from occurring in the alternating layers in the nanostructure 1155B.

In an embodiment, a method of a semiconductor device fabrication includes: providing a substrate having a first region and a second region; forming a plurality of trenches in the first region of the substrate; forming a multi-layer stack over the substrate and in the trenches; and patterning the multi-layer stack and the substrate to form first nanostructures over first fins in the first region and second nanostructures over second fins in the second region, where the multi-layer stack includes at least one of first semiconductor layers and at least one of second semiconductor layer stacked alternately, and the plurality of trenches are in corresponding ones of the first fins.

In another embodiment, a method for a semiconductor device fabrication includes forming a plurality of trenches in a first region of a substrate; annealing the substrate in H$_2$ or a mixture of H$_2$ and N$_2$; after annealing, epitaxially growing alternating first semiconductor layers and second semiconductor layers over the substrate in the first region and a second region, the alternating first semiconductor layers and second semiconductor layers being extending into the trenches; patterning the alternating first semiconductor layers and second semiconductor layers to form nanostructures in the first region and in the second region; and forming gate structures over respective portions of the nanostructures in the second region.

In yet embodiment, a semiconductor device includes a substrate having a dicing region and a chip region; a gate structure disposed in the chip region; and an alignment structure disposed in the dicing region. The alignment structure includes fins protruding from the substrate and nanostructures disposed over the fins, where each of the nanostructures comprise alternately stacked first semiconductor layers and second semiconductor layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor device fabrication, the method comprising:
   forming a plurality of trenches in a first region of a substrate;
   forming a multi-layer stack over the first region and a second region of the substrate, wherein the multi-layer stack extends into the trenches, wherein the multi-layer stack comprises at least one first semiconductor layer and at least one second semiconductor layer stacked alternately; and
   patterning the multi-layer stack and the substrate to form first nanostructures over first fins in the first region and second nanostructures over second fins in the second region, wherein the plurality of trenches in corresponding ones of the first fins.

2. The method of claim 1, further comprising forming:
   forming an insulating layer over the first nanostructures and the second nanostructures; and
   etching the insulating layer in the second region without etching the insulating layer in the first region.

3. The method of claim 2, wherein the step of etching the insulating layer exposes the second nanostructures in the second region, and the method further comprises forming respective gate structures over the insulating layer and across the second nanostructures.

4. The method of claim 3, further comprising removing the first semiconductor layer in the second region without removing the first semiconductor layer in the first region before forming the gate structures.

5. The method of claim 1, wherein the at least one second semiconductor layer and the substrate are a same material.

6. The method of claim 1, wherein the first region is a dicing region.

7. The method of claim 1, wherein each of the plurality of trenches have a depth in a range from 50 nm to 250 nm.

8. The method of claim 1, further comprising:
   forming a third semiconductor layer over the multi-layer stack in the first region and in the second region, wherein the third semiconductor layer extends into the plurality of trenches; and
   performing a polishing process, wherein after the polishing process an upper surface of the third semiconductor layer in the first region is level with an upper surface of the multi-layer stack.

9. The method of claim 8, wherein the polishing process comprises completely removing the third semiconductor layer in the second region.

10. The method of claim 8, wherein the polishing process comprises using the first semiconductor layer or the second semiconductor layer as a polishing stop layer.

11. The method of claim 1, further comprising rounding corners of the plurality of trenches before forming the multi-layer stack.

12. The method of claim 11, wherein the rounding comprises performing an anneal process to the substrate before forming the multi-layer stack in $H_2$ or a mixture of $H_2$ and $N_2$.

13. A method of semiconductor device fabrication, the method comprising:
   annealing a substrate in an atmosphere containing oxygen;
   forming a plurality of trenches in a first region of a substrate, after annealing the substrate;
   annealing the substrate in $H_2$ or a mixture of $H_2$ and $N_2$, wherein the step of annealing the substrate in $H_2$ or a mixture of $H_2$ and $N_2$ is operated at a temperature lower than that of the step of annealing the substrate in an atmosphere containing oxygen;
   after annealing, epitaxially growing alternating first semiconductor layers and second semiconductor layers over the substrate in the first region and a second region, wherein the alternating first semiconductor layers and second semiconductor layers extend into the trenches;
   patterning the alternating first semiconductor layers and second semiconductor layers to form nanostructures in the first region and in the second region; and
   forming gate structures over respective portions of the nanostructures in the second region.

14. The method of claim 13, wherein the step of annealing the substrate in an atmosphere containing oxygen is performed at a temperature in a range of from 1000° C. to 1250° C.

15. The method of claim 14, wherein the step of annealing the substrate in $H_2$ or a mixture of $H_2$ and $N_2$ is performed at a temperature in a range of from 700° C. to 1,200° C.

16. A method of semiconductor device fabrication, the method comprising:
   forming an alignment trench in an alignment region of a semiconductor wafer;
   depositing over the semiconductor wafer a stack of alternating first semiconductor layers and second semiconductor layers, the stack extending over the semiconductor wafer in a device region of the semiconductor wafer and in the alignment region of the semiconductor wafer, the stack further lining the alignment trench in the alignment region of the semiconductor wafer to form a first alignment structure;
   patterning the stack and the semiconductor wafer to form a channel stack over a first fin in the device region of the semiconductor wafer and to form a second alignment structure over a second fin in the alignment region of the semiconductor wafer, wherein the second alignment structure includes portions of the first semiconductor layers and the second semiconductor layers extending below a topmost surface of the second fin;
   depositing an insulation layer over the channel stack and first fin and over the second alignment structure; and
   forming a gate over the channel stack.

17. The method of claim 16, further comprising:
   depositing a photoresist layer over the stack of alternating first semiconductor layers and second semiconductor layers in the device region and over the first alignment structure in the alignment region;

patterning the photoresist layer to form a first patterning structure in the device region of the semiconductor wafer and a second patterning structure over the first alignment structure in the alignment region; and determining an amount of position shift for the first patterning structure by measuring an amount of overlay position shift of the second patterning structure relative to the first alignment structure.

18. The method of claim 16, wherein the step of forming the alignment trench in the alignment region of the semiconductor wafer includes forming a pattern of trenches, the pattern including first trenches extending in a first longitudinal direction and second trenches extending orthogonal to the first trenches.

19. The method of claim 16, further comprising: filling the alignment trench with a dielectric fill material after lining the alignment trench with the stack.

20. The method of claim 16, further comprising rounding corners of the alignment trench after the step of depositing over the semiconductor wafer the stack of alternating the first semiconductor layers and the second semiconductor layers.

* * * * *